(12) United States Patent
Minamio et al.

(10) Patent No.: US 6,680,524 B2
(45) Date of Patent: Jan. 20, 2004

(54) SEMICONDUCTOR DEVICE AND METHOD FOR FABRICATING THE SAME

(75) Inventors: Masanori Minamio, Takatsuki (JP); Hiroaki Fujimoto, Hirakata (JP); Ryuichi Sahara, Hirakata (JP); Toshiyuki Fukuda, Kyoto (JP); Toru Nomura, Amagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/983,336

(22) Filed: Oct. 24, 2001

(65) Prior Publication Data

US 2002/0050631 A1 May 2, 2002

(30) Foreign Application Priority Data

Oct. 26, 2000 (JP) .......................................... 2000-326600

(51) Int. Cl.⁷ ............................................... H01L 23/02
(52) U.S. Cl. ....................... 257/678; 257/666; 257/676; 257/784; 257/787
(58) Field of Search ................................. 257/666, 686, 257/688, 687, 678, 782, 783, 784, 787, 676, 618, 619, 620; 438/106, 108, 112, 117, 121, 119, 124, 127, 458, 459, 462, 977

(56) References Cited

U.S. PATENT DOCUMENTS

| | | | |
|---|---|---|---|
| 6,172,423 B1 * | 1/2001 | Lee ............................. | 257/784 |
| 6,208,023 B1 * | 3/2001 | Nakayama et al. ......... | 257/696 |
| 6,211,462 B1 * | 4/2001 | Carter, Jr. et al. .......... | 257/666 |
| 6,245,598 B1 * | 6/2001 | Chen et al. .................. | 438/126 |
| 6,284,565 B1 * | 9/2001 | Tachibana et al. .......... | 438/106 |
| 6,288,904 B1 * | 9/2001 | Houdeau et al. ............ | 257/668 |
| 6,384,472 B1 * | 5/2002 | Huang ......................... | 257/676 |
| 6,396,159 B1 * | 5/2002 | Shoji .......................... | 257/788 |
| 6,437,429 B1 * | 8/2002 | Su et al. ..................... | 257/666 |
| 6,475,827 B1 * | 11/2002 | Lee et al. .................... | 438/106 |
| 6,501,161 B1 * | 12/2002 | Lee ............................. | 257/676 |

* cited by examiner

Primary Examiner—Shouxiang Hu
Assistant Examiner—Quang Vu
(74) Attorney, Agent, or Firm—Nixon Peabody LLP; Donald R. Studebaker

(57) ABSTRACT

A semiconductor device includes: a wiring substrate; a wiring electrode; a semiconductor chip; a connecting member; and a resin encapsulant. The wiring electrode is formed on the wiring substrate. The semiconductor chip is mounted on the wiring substrate and a second bottom face of the semiconductor chip is in contact with the wiring substrate. An electrode pad formed on the semiconductor chip and the wiring electrode are electrically connected to each other with the connecting member. The semiconductor chip, the wiring electrode, and the connecting member, for example, are molded with the resin encapsulant on the upper surface of the wiring substrate. A level difference exists between a first bottom face and the second bottom face of the semiconductor chip. The first and second bottom faces are respectively located at a peripheral portion and a central portion of the semiconductor chip. A part of the resin encapsulant is interposed between the first bottom face and the upper surface of the wiring substrate. Thus, the resin encapsulant and the semiconductor chip are secured more strongly to each other, and so are the resin encapsulant and the wiring substrate.

5 Claims, 20 Drawing Sheets

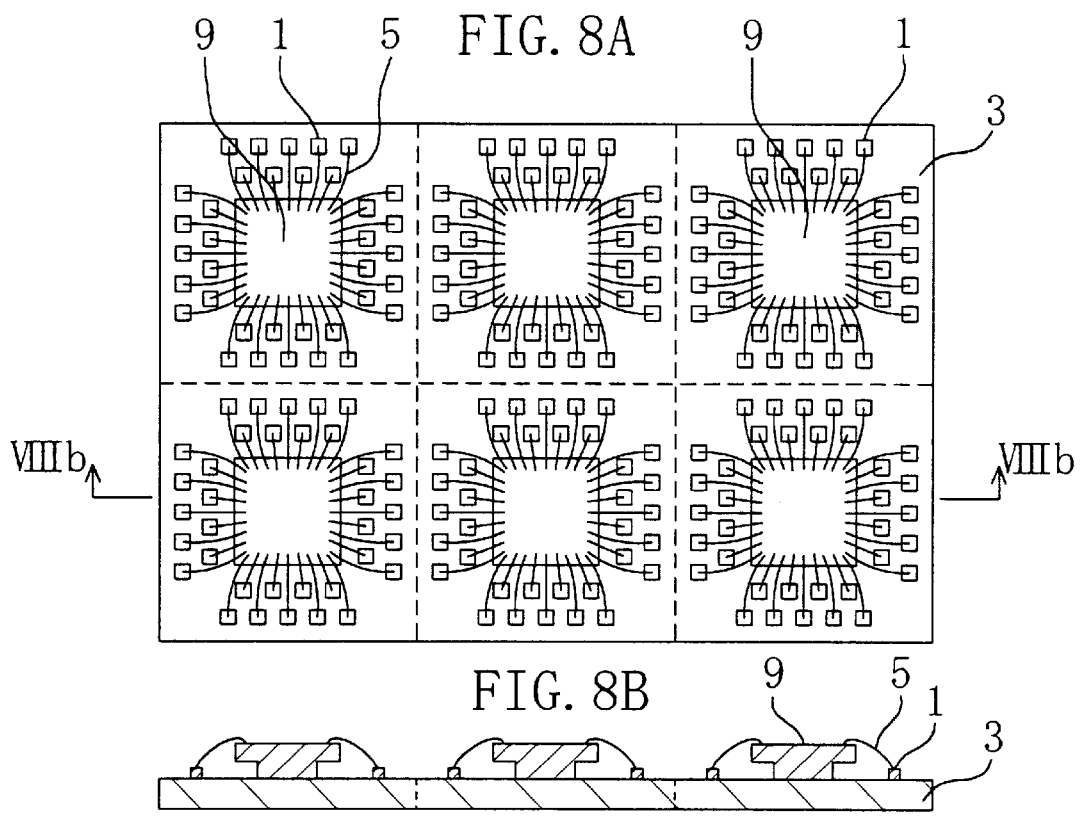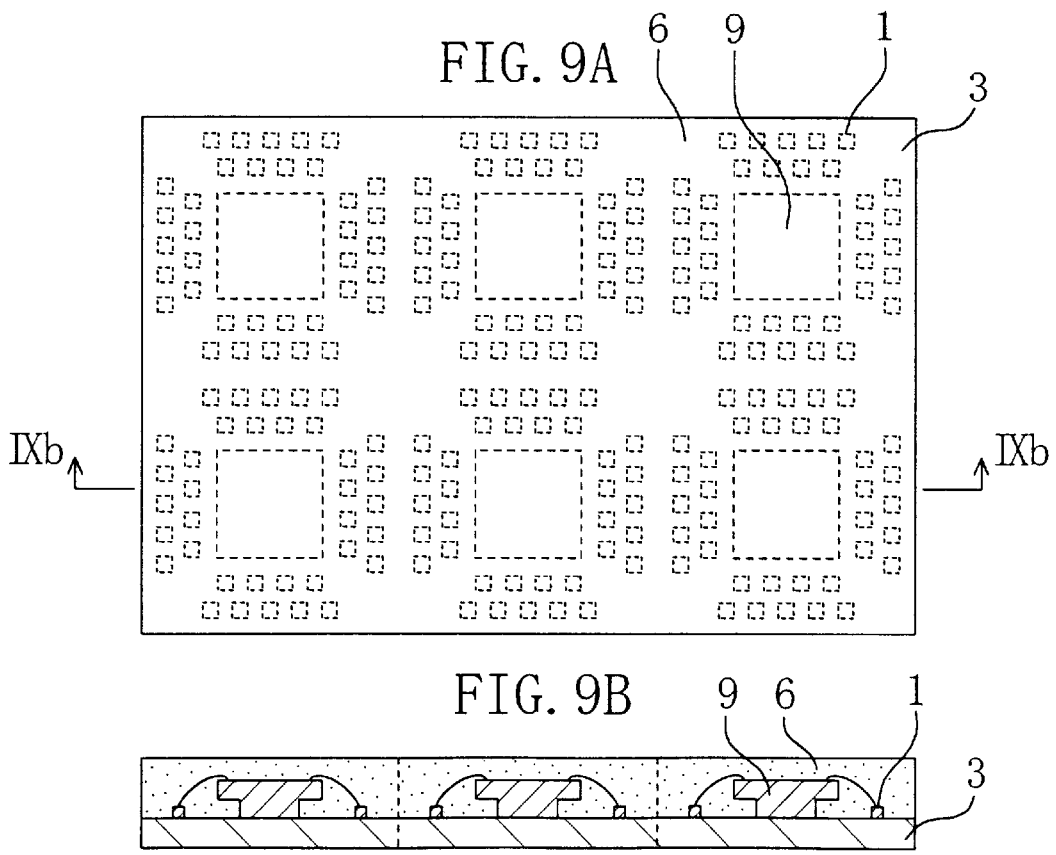

SEMICONDUCTOR DEVICE AND METHOD FOR FABRICATING THE SAME

BACKGROUND OF THE INVENTION

The present invention relates to a single-side-molded semiconductor device, which includes a wiring substrate having a ball grid array (BGA) arranged on the lower surface and a semiconductor chip molded with a resin encapsulant on the upper surface. The present invention also relates to a method for fabricating the device.

A semiconductor device of the BGA type has been available as a semiconductor device of an area array type. In the BGA type semiconductor device, a semiconductor chip is mounted and molded with a resin encapsulant on the upper surface of a substrate, and ball electrodes are attached to the lower surface thereof.

FIG. 21 is a plan view illustrating a known semiconductor device of the BGA type. FIG. 22 is a bottom view illustrating the known BGA type semiconductor device. FIG. 23 is a cross-sectional view thereof taken along the line XXIII—XXIII in FIG. 21.

As shown in FIGS. 21, 22 and 23, the known semiconductor device includes a wiring substrate 103, wiring electrodes 101, a semiconductor chip 104, metal fine wires 105, ball electrodes 102 and a resin encapsulant 106. The wiring substrate 103 is made of an insulating resin. The wiring electrodes 101 are formed on the wiring substrate 103. The semiconductor chip 104 is mounted on the wiring substrate 103 with the principal surface of the semiconductor chip 104 facing upward. Electrode pads (not shown) formed on the semiconductor chip 104 and the wiring electrodes 101 are electrically connected to each other with the metal fine wires 105. The ball electrodes 102 are formed on the lower surface of the wiring substrate 103. The resin encapsulant 106 is provided on the upper surface of the wiring substrate 103. The semiconductor chip 104, wiring electrodes 101, metal fine wires 105 and the like are molded with the resin encapsulant 106 on the upper surface of the wiring substrate 103. Although not shown in FIG. 23, external pad electrodes are formed on the lower surface of the wiring substrate 103. The external pad electrodes are electrically connected to the wiring electrodes 101 through the substrate. The ball electrodes 102 are formed on the external pad electrodes.

The known semiconductor device has an approximately rectangular planar shape and the adjacent side faces thereof are perpendicular to each other. The outer shape has been determined so that the fabrication process of the semiconductor device can be simplified.

Also in the known semiconductor device, the ball electrodes 102 attached to the wiring substrate 103 are solder balls. The solder balls are attached to the wiring substrate 103 so that the overall semiconductor device can be highly reliably mounted and bonded onto a motherboard. In addition, as shown in FIG. 22, the ball electrodes 102 are arranged on the lower surface of the wiring substrate 103 in a latticed shape.

Next, the fabrication process of the known semiconductor device will be described. FIGS. 24A and 24B are respectively a plan view and a bottom view illustrating a known wiring substrate. FIGS. 25A and 25B are plan views illustrating a substrate preparation process step and a die bonding process step, respectively, in the fabrication process of the known semiconductor device. FIGS. 26A and 26B are plan views illustrating a wire bonding process step and a resin molding process step, respectively, in the fabrication process of the known semiconductor device. FIG. 27 illustrates a cutting process step in the fabrication process of the known semiconductor device.

As shown in FIGS. 24A and 24B, the multiple wiring electrodes 101 are formed on the upper surface of the wiring substrate, and external pad electrodes 107 are formed on the lower surface of the wiring substrate. The external pad electrodes 107 are electrically connected to the wiring electrodes 101 through the substrate. The ball electrodes will be attached to the external pad electrodes 107 in the subsequent process step. The wiring substrate is a large-sized substrate on which multiple semiconductor chips will be mounted and which will be separated into individual semiconductor devices. The broken lines shown in FIGS. 24A and 24B are cutting lines, which will be used to separate the substrate into the individual semiconductor devices. Also, in each of the regions defined by the cutting lines in FIG. 24, a central area surrounded by each array of the wiring electrodes 101 is a chip mounting area where each of the semiconductor chips is mounted by bonding.

First, the wiring substrate with the structure shown in FIGS. 24A and 24B is prepared in the substrate preparation process step shown in FIG. 25A.

Next, each of the semiconductor chips 104 is bonded, with an adhesive, onto each of the chip mounting areas of the wiring substrate in the die bonding process step shown in FIG. 25B.

Subsequently, the electrode pads (not shown) formed on the principal surface of each of the semiconductor chips 104 and their associate wiring electrodes 101 formed on the wiring substrate are electrically connected to each other with the metal fine wires 105 in the wire bonding process step shown in FIG. 26A.

Then, the members disposed on the upper surface of the wiring substrate, e.g., the semiconductor chips 104, wiring electrodes 101, metal fine wires 105, are transfer-molded with the resin encapsulant 106 in the resin molding process step shown in FIG. 26B. The wiring electrodes 101 and semiconductor chips 104 are indicated by the broken lines in FIG. 26B. However, the metal fine wires 105 are not shown in the figure.

Next, in the cutting process step shown in FIG. 27, the wiring substrate having the upper surface entirely molded with the resin encapsulant 106 is cut along the cutting lines using a rotary blade, thereby obtaining individual semiconductor devices 108 of the BGA type. Hence, the semiconductor devices 108 with the structure shown in FIGS. 22 and 23 can be obtained.

In this example, the wiring substrate is cut, using the rotary blade, along the cutting lines indicated by the broken lines shown in FIGS. 24A and 24B. In this manner, the individual semiconductor devices can be obtained accurately. Normally, the separation by a rotary blade is performed using a dicing machine generally used in the fabrication process of a semiconductor device. Also, in the cutting process step, the wiring substrate is cut from either the lower surface or the resin encapsulant 106 side thereof.

In the subsequent process step, which is not shown, in each of the individual semiconductor devices 108, a solder ball is attached to each of the external pad electrodes 107 formed on the lower surface of the wiring substrate 103. In this manner, the multiple ball electrodes are formed and will be used as external terminals.

The process steps for fabricating the known semiconductor device have been performed in the above-described manner, i.e., the large-sized substrate on which the multiple semiconductor chips can be mounted is used. Then, a large number of semiconductor chips are mounted on the substrate, the associate members are electrically connected via the metal fine wires, and the members disposed on the upper surface of the wiring substrate are molded with the resin encapsulant. Thereafter, the wiring substrate is cut using the rotary blade and separated into the individual semiconductor devices.

However, the known semiconductor device has drawbacks, i.e., the humidity- and stress- resistance of the semiconductor device is low. This might be because neither the semiconductor chip 104 and resin encapsulant 106 nor the wiring substrate 103 and resin encapsulant 106 are sufficiently secured to each other.

For this reason, it is difficult to increase the reliability of the semiconductor device. Particularly, it is important to obtain the reliability of semiconductor devices used in small electronic units such as mobile phones.

SUMMARY OF THE INVENTION

An object of the present invention is providing (1) a semiconductor device of the BGA type with reliable humidity resistance, for example, by using a semiconductor chip having an inverted convex cross-sectional shape instead of a semiconductor chip used in the known semiconductor device, and (2) a method for fabricating the device.

An inventive semiconductor device includes: a wiring substrate; a semiconductor chip; an electrode; a connecting member; and an resin encapsulant. The wiring substrate includes a wiring electrode and an external electrode, respectively, on the upper surface and the lower surface of the wiring substrate. The external electrode is to be electrically connected to the wiring electrode. The semiconductor chip includes: a principal surface; a first bottom face which is opposite to the principal surface; and a second bottom face which protrudes from the first bottom face. The semiconductor chip is mounted on the wiring substrate with the second bottom face being in contact with the upper surface of the wiring substrate. The electrode is formed on the principal surface the semiconductor chip. The connecting member is used to connect the electrode of the semiconductor chip and the wiring electrode formed on the wiring substrate electrically to each other. The resin encapsulant molds the semiconductor chip, the connecting member and the wiring electrode on the upper surface of the wiring substrate. A part of the resin encapsulant exists between the first bottom face of the semiconductor chip and the upper surface of the wiring substrate.

According to the present invention, a part of the resin encapsulant exists between the first bottom face of the semiconductor chip and the wiring substrate. Thus, the semiconductor device can have its humidity resistance improved and also can have its stress resistance to impact from the outside, improved. Accordingly, the highly reliable semiconductor device can be obtained.

In one embodiment of the present invention, a concave portion may be formed in the upper surface of the wiring substrate. Also, the wiring electrode may be formed outside the concave portion. And the second bottom face of the semiconductor chip may be in contact with the bottom face of the concave portion of the wiring substrate. In such an embodiment, the semiconductor device can have its reliability improved further.

In another embodiment of the present invention, in the semiconductor chip, a protrusion length of the second bottom face from the first bottom face is preferably equal to or less than 50% of a thickness of the semiconductor chip.

In still another embodiment, the second bottom face is preferably located approximately in a center region of the back face of the semiconductor chip.

In still another embodiment, the device may further include a ball electrode which is attached to the external electrode of the wiring substrate. Then, the semiconductor device can be mounted on a motherboard more easily.

An inventive method for fabricating a semiconductor device includes the step of a) preparing a wiring substrate, which includes a wiring electrode and an external electrode, respectively, on the upper surface and the lower surface of the wiring substrate. The external electrode is to be electrically connected to the wiring electrode. The method further includes the step of b) preparing a semiconductor chip. The semiconductor chip includes: a principal surface; a first bottom face which is opposite to the principal surface; and a second bottom face which protrudes from the first bottom face. An electrode is formed on the principal surface. The method further includes the step of c) mounting the semiconductor chip on the wiring substrate with the second bottom face secured to the upper surface of the wiring substrate. The method further includes the step of d) connecting the electrode of the semiconductor chip and the wiring electrode on the wiring substrate electrically to each other with a connecting member. And the method further includes the step of e) molding the semiconductor chip, the connecting member and the wiring electrode on the upper surface of the wiring substrate so that a part of a resin encapsulant exists between the first bottom face of the semiconductor chip and the upper surface of the wiring substrate.

According to the present invention, a highly reliable semiconductor device can be fabricated more easily.

In one embodiment of the present invention, the step b) may further include the sub step of: b1) forming, in a semiconductor wafer, chip regions defined by cutting lines. Each of the chip regions has an integrated circuit disposed on the principal surface of each said chip region. The step b) may further include the sub step of b2) forming a groove in a region of the back face of the semiconductor wafer. The region is located at both sides of each of the cutting lines. And the step b) may further include the sub step of b3) separating the semiconductor wafer along the cutting lines into the chip regions, thereby obtaining semiconductor chips, each of which has the first bottom face and the second bottom face. The first bottom face is a part of the bottom face of the groove, and the second bottom face is a part of the back face of the semiconductor wafer. In such an embodiment, a semiconductor chip, which has an inverted convex cross-sectional shape when mounted on a wiring substrate, can be fabricated more easily.

In another embodiment of the present invention, in the step a), a concave portion may be formed in the upper surface of the wiring substrate and the wiring electrode may be disposed outside the concave portion. Also in the step c), the semiconductor chip may be secured to the bottom face of the concave portion of the wiring substrate. Then, a semiconductor device with even higher reliability can be fabricated.

In this particular embodiment, in the step a), the concave portion of the wiring substrate preferably has a depth equal to or less than 40% of a thickness of the semiconductor chip.

BRIEF DESCRIPTION OF THE DRAWINGS

FIGS. 8A and 8B are respectively a plan view, and a cross-sectional view taken along the line VIIIb—VIIIb, illustrating a wire bonding process step in the fabrication process of the semiconductor device of the first embodiment.

FIGS. 9A and 9B are respectively a plan view, and a cross-sectional view taken along the line IXb—IXb, illustrating a resin molding process step in the fabrication process of the semiconductor device of the first embodiment.

DESCRIPTION OF THE PREFERRED EMBODIMENTS

Embodiment 1

Figure 1:
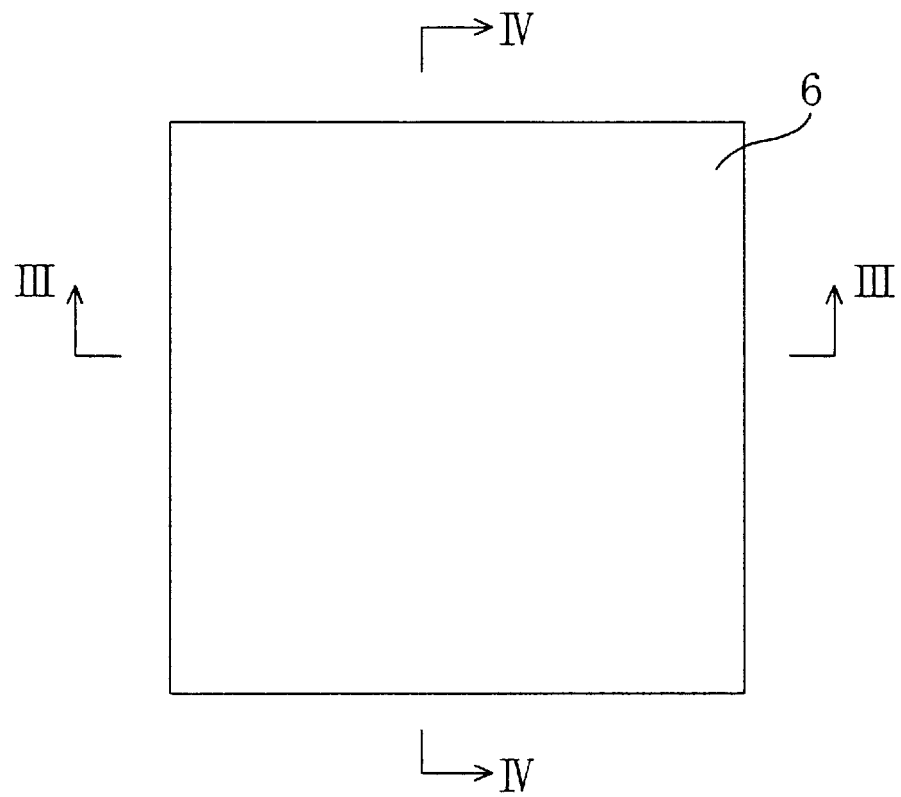
FIG. 1 is a plan view illustrating a semiconductor device in accordance with a first embodiment of the present invention.
Figure 2:
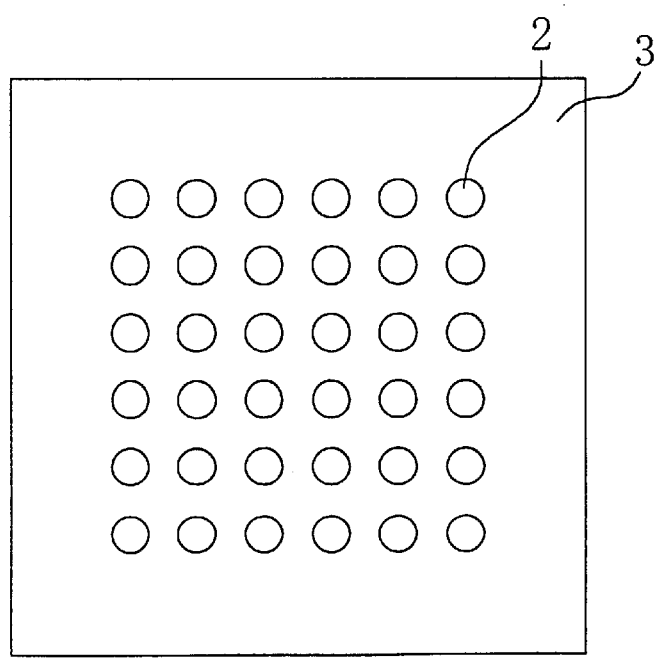
FIG. 2 is a bottom view illustrating the semiconductor device of the first embodiment.
Figure 3:
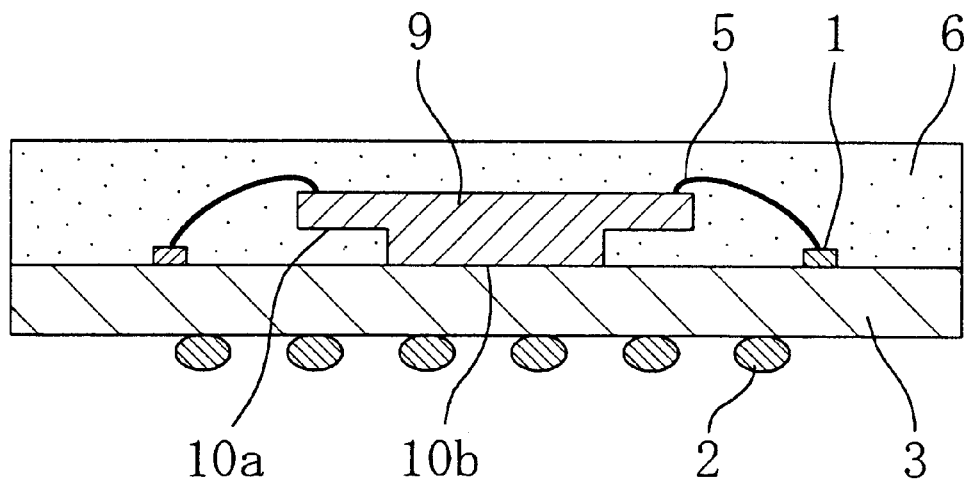
FIG. 3 is a cross-sectional view taken along the line III—III in FIG. 1, illustrating the semiconductor device of the first embodiment.
Figure 4:
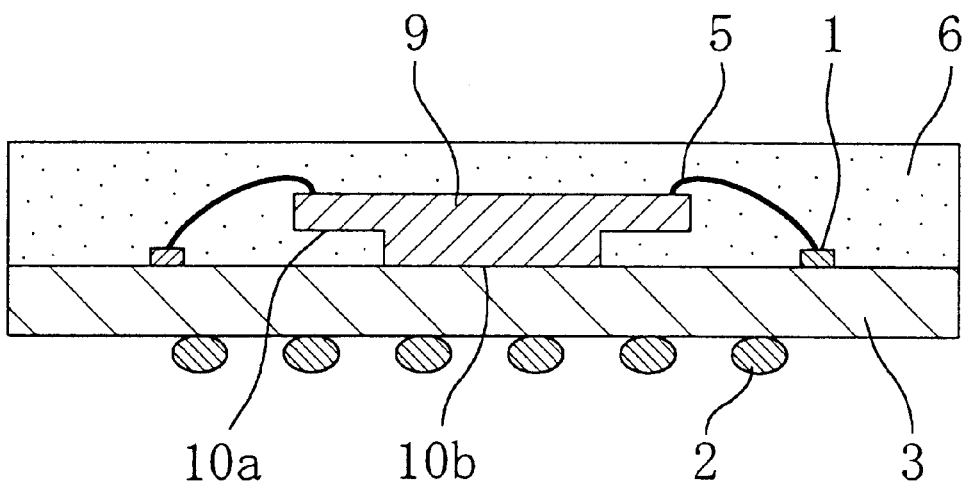
FIG. 4 is a cross-sectional view taken along the line IV—IV in FIG. 1, illustrating the semiconductor device of the first embodiment.

FIG. 1 is a plan view illustrating a semiconductor device in accordance with a first embodiment of the present invention. FIG. 2 is a bottom view illustrating the semiconductor device of the first embodiment. FIG. 3 is a cross-sectional view thereof taken along the line III—III in FIG. 1. FIG. 4 is a cross-sectional view thereof taken along the line IV—IV in FIG. 1.

As shown in FIGS. 1, 2, 3 and 4, the semiconductor device of this embodiment includes a wiring substrate 3, wiring electrodes 1, a semiconductor chip 9, metal fine wires 5, ball electrodes 2 and a resin encapsulant 6. The wiring substrate 3 is made of an insulating resin. The wiring electrodes 1 are formed on the wiring substrate 3. The semiconductor chip 9 is mounted on the wiring substrate 3. The second bottom face of the semiconductor chip 9 is in contact with the wiring substrate 3. Electrode pads (not shown) formed on the principal surface of the semiconductor chip 9 and the wiring electrodes 1 are electrically connected to each other with the metal fine wires 5. The ball electrodes 2 are formed on the lower surface of the wiring substrate 3. The semiconductor chip 9, wiring electrodes 1, metal fine wires 5 and the like are molded with the resin encapsulant 6 on the upper surface of the wiring substrate 3. Although not shown in FIG. 2, external pad electrodes are formed on the lower surface of the wiring substrate 3. The external pad electrodes are electrically connected to the wiring electrodes 1 through the substrate. The ball electrodes 2 are formed on the external pad electrodes. This is to say, the semiconductor device of this embodiment has the structure of a semiconductor device of the BGA type. Although not shown in FIGS. 3 and 4, an integrated circuit, on which e.g., a large number of transistors are disposed, is formed near the principal surface in the semiconductor chip. In addition, electrode pads to be used for connection with outside units are also formed on wiring layers formed near the principal surface in the semiconductor chip. And one end of each of the metal fine wires 5 is connected to the associated one of the electrode pads on the semiconductor chip.

The semiconductor device according to this embodiment includes the semiconductor chip 9 that has an inverted convex cross-sectional shape. The central portion of the back face of the semiconductor chip 9 protrudes downward out of the peripheral portion thereof. This is to say, a level difference exists between a first bottom face 10a, i.e., the back face of the peripheral portion of the semiconductor chip 9, and a second bottom face 10b, i.e., the back face of the central portion thereof. In the semiconductor device of this embodiment, part of the resin encapsulant 6 is interposed between the first bottom face 10a of the semiconductor chip 9 and the upper surface of the wiring substrate 3.

In the semiconductor device of this embodiment, the protrusion length of the second bottom face 10b of the semiconductor chip 9 with the inverted convex cross-sectional shape is equal to or less than 50% of the overall thickness (chip thickness) of the semiconductor chip 9. Therefore, a gap with a thickness equal to or less than 50% of the chip thickness is formed between the upper surface of the wiring substrate 3 and the first bottom face 10a of the semiconductor chip 9. Part of the resin encapsulant 6 exists in the gap. Also, the second bottom face 10b of the semiconductor chip 9 is located approximately in a center region of the back face of the semiconductor chip 9.

In addition, in the semiconductor device of this embodiment, the ball electrodes 2 attached to the wiring substrate 3 are solder balls. The solder balls are attached so that the overall semiconductor device can be mounted and bonded onto a motherboard highly reliably. Also, as shown in FIG. 2, the ball electrodes 2 are arranged on the lower surface of the wiring substrate 3 in a latticed shape.

The BGA type semiconductor device of this embodiment includes the semiconductor chip 9, the back face of which has the first bottom face 10a and the second bottom face 10b protruding from the first bottom face 10a. Part of the resin encapsulant 6 molding the members disposed on the upper surface of the wiring substrate 3 is interposed between the first bottom face 10a of the semiconductor chip 9 and the upper surface of the wiring substrate 3. Thus, the semiconductor device can have its humidity resistance increased, and also can have its stress resistance to impact given to the resin encapsulant 6 and wiring substrate 3 from the outside, improved.

Figure 23:
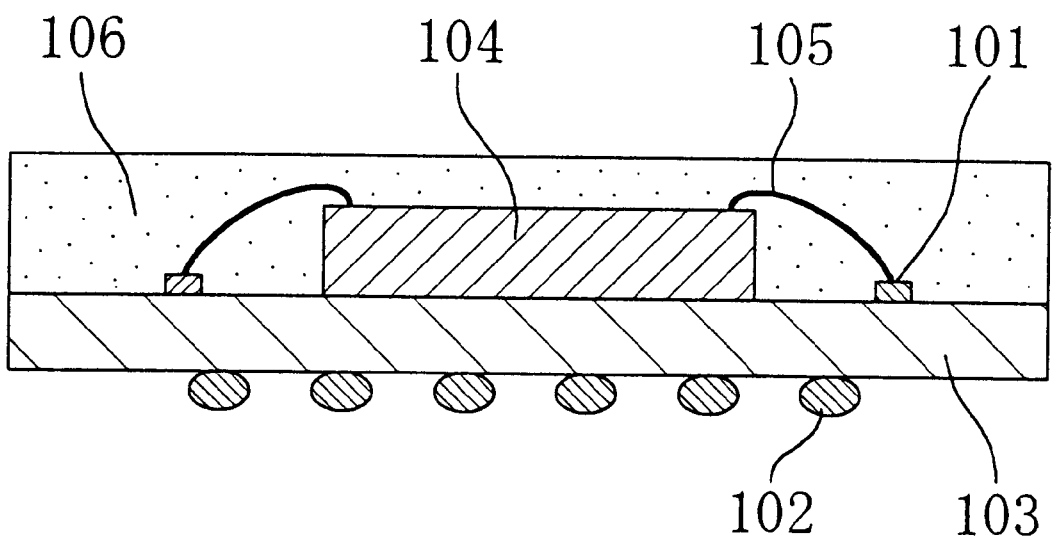
FIG. 23 is a cross-sectional view taken along the line XXIII—XXIII in FIG. 21, illustrating the known BGA type semiconductor device.
Figure 24A:
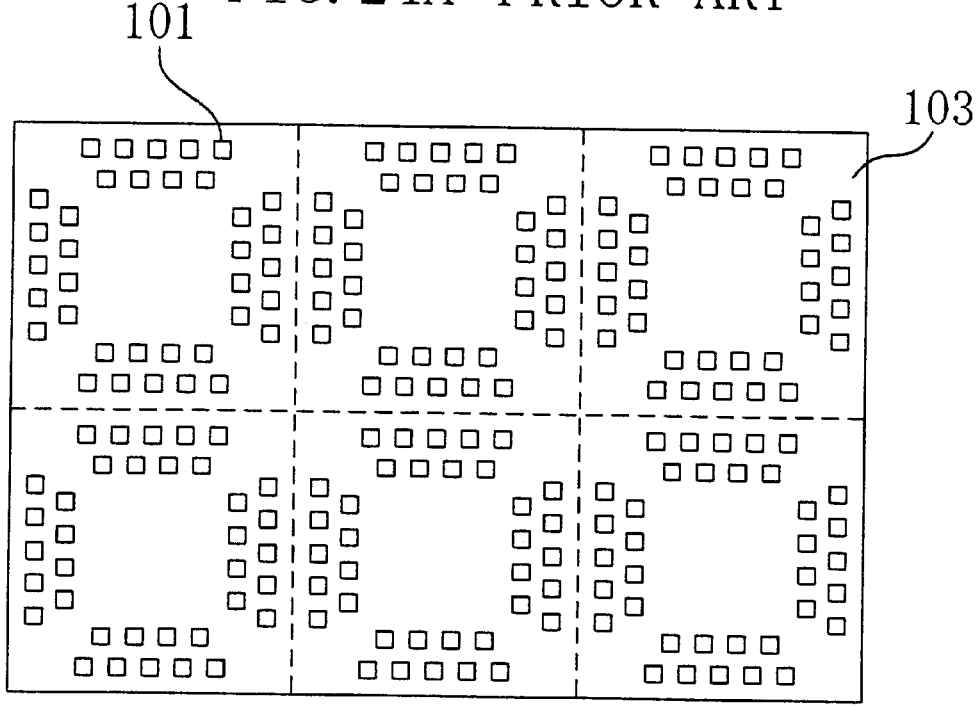
FIGS. 24A and 24B are respectively a plan view and a bottom view illustrating a known wiring substrate of the known semiconductor device.
Figure 24B:
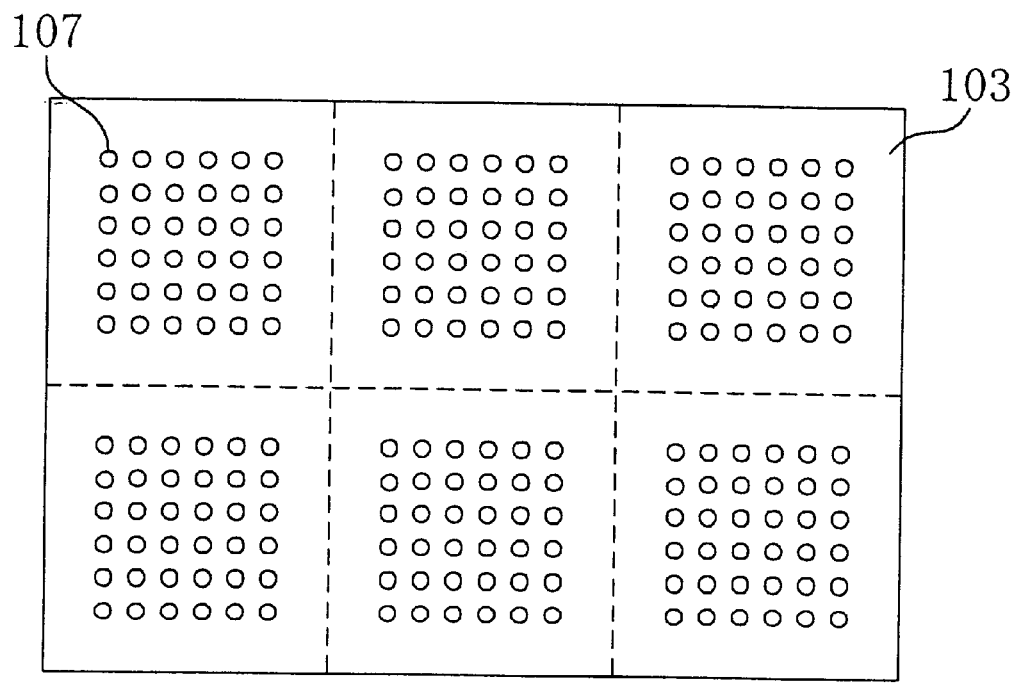
Figure 25A:
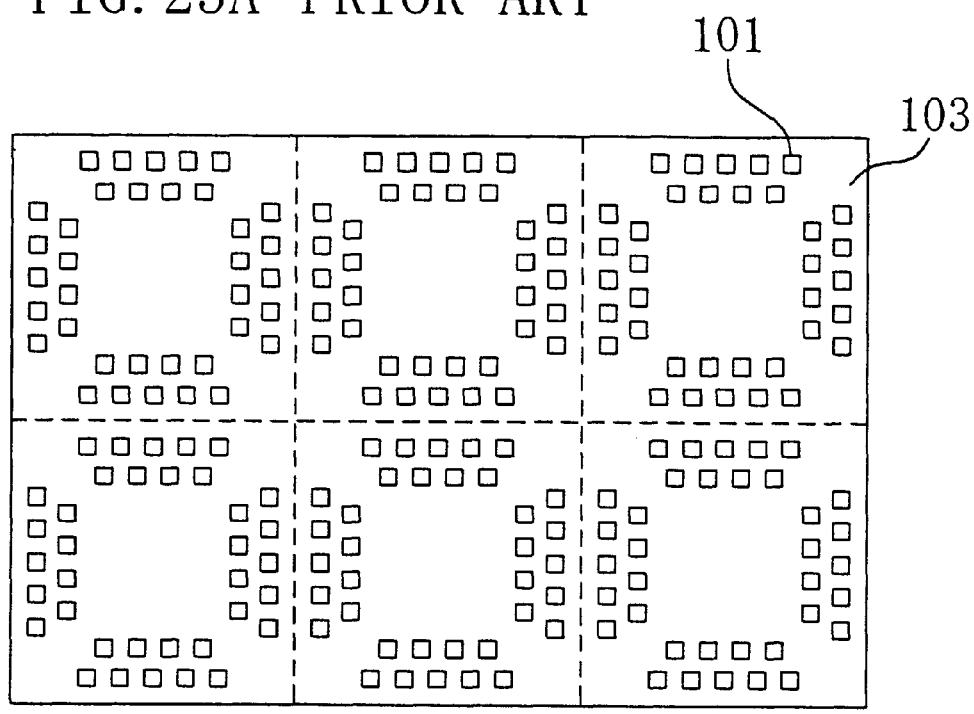
FIGS. 25A and 25B are plan views illustrating a substrate preparation process step and a die bonding process step, respectively, in the fabrication process of the known semiconductor device.
Figure 25B:
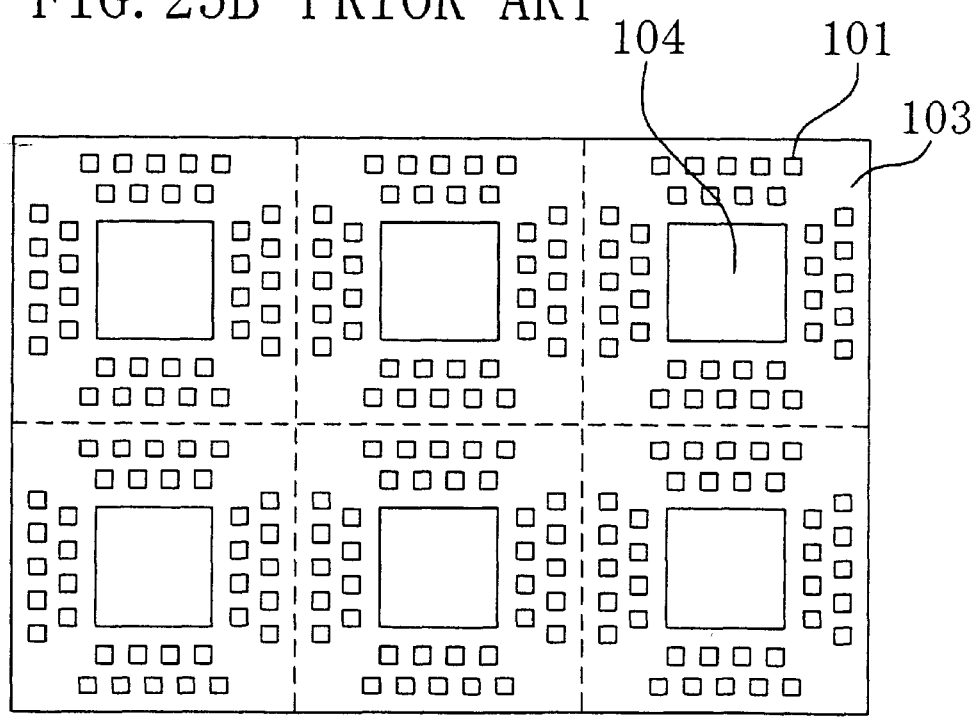
Figure 26A:
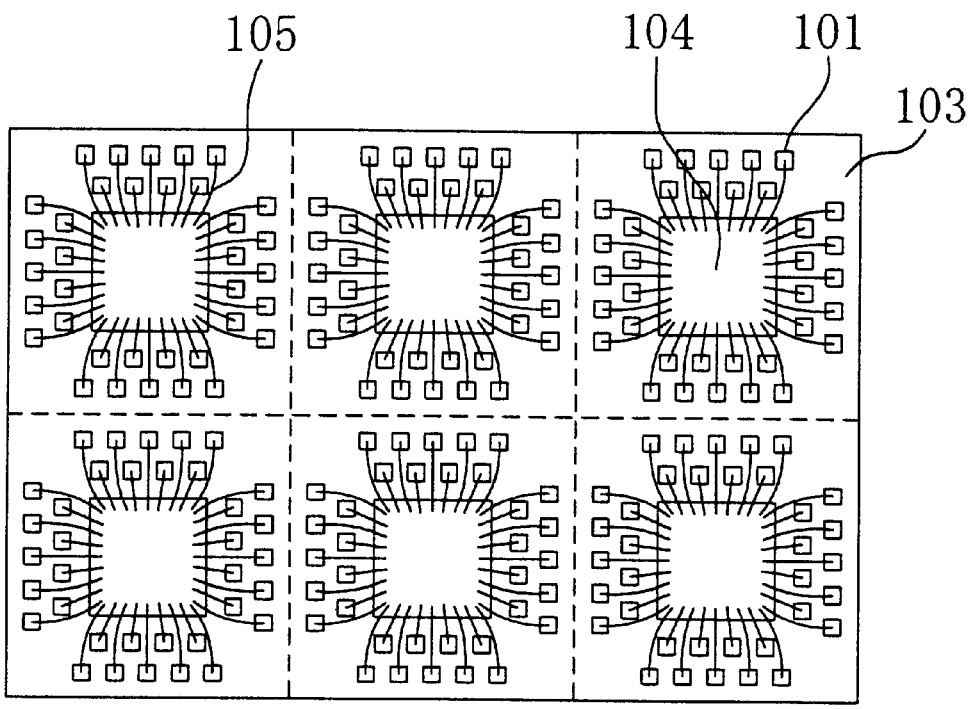
FIGS. 26A and 26B are plan views illustrating a wire bonding process step and a resin molding process step, respectively, in the fabrication process of the known semiconductor device.
Figure 26B:
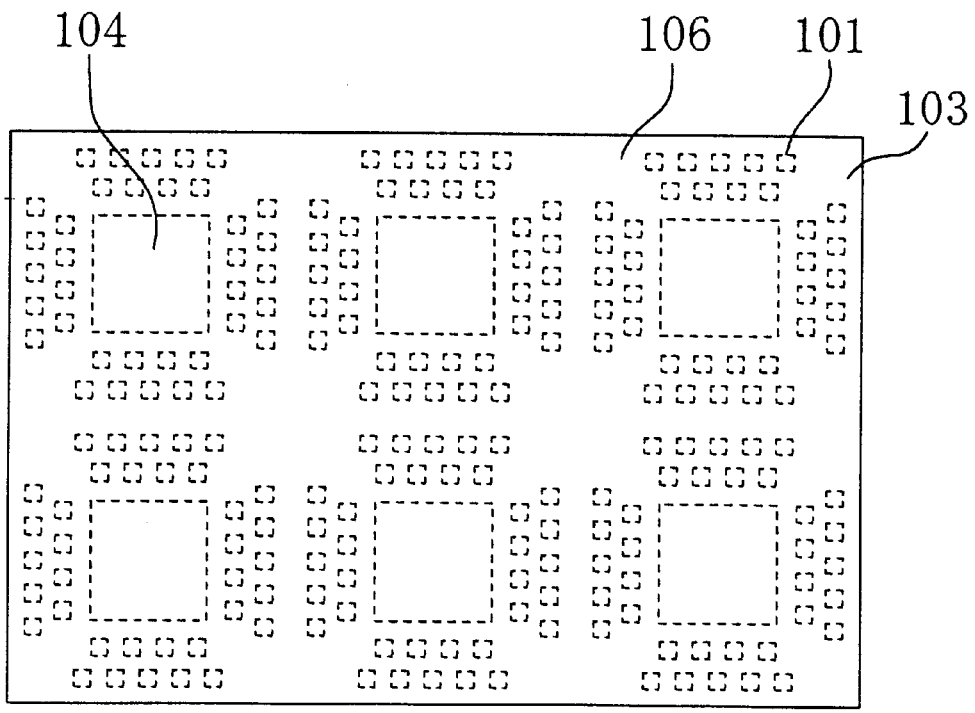
Figure 27:
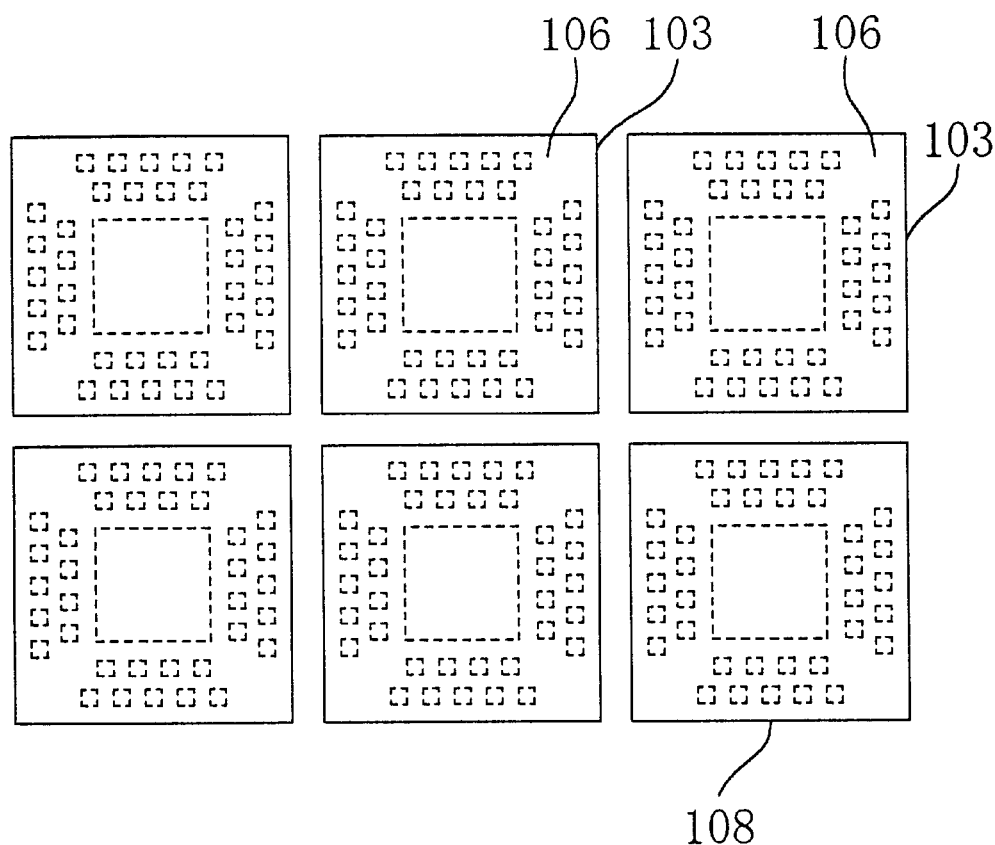
FIG. 27 illustrates a cutting process step in the fabrication process of the known semiconductor device.

In the known semiconductor device shown in FIG. 23, when water or moisture enters from between the wiring substrate 103 and resin encapsulant 106, the water or moisture soon reaches the principal surface of the semiconductor chip 104 through the side faces thereof. Thus, the reliability of the semiconductor device might deteriorate.

In contrast, in the semiconductor device of this embodiment, even when water or moisture enters from between the wiring substrate 3 and resin encapsulant 6, the water or moisture does not reach the principal surface of the semiconductor chip 9 soon. The water or moisture first reaches the first bottom face 10a by penetrating into side walls between the first and second bottom faces 10a and 10b before reaching the principal surface of the semiconductor chip 9. Therefore, it is possible to suppress the water, for example, from entering into the area where the integrated circuit is formed, thus allowing the semiconductor device to have its humidity resistance increased. Also, in the semiconductor device of this embodiment, the area where the resin encapsulant 6 and semiconductor chip 9 are in contact with each other and the area where the resin encapsulant 6 and wiring substrate 3 are in contact with each other are respectively increased by the area of the first bottom face 10a, as compared to the known semiconductor device. Thus, the resin encapsulant 6 and semiconductor chip 9 are secured to each other more strongly, and so are the resin encapsulant 6 and wiring substrate 3. Accordingly, the semiconductor device has its stress resistance to impact from the outside improved. As a result, the overall reliability of the semiconductor device improves.

Figure 5A:
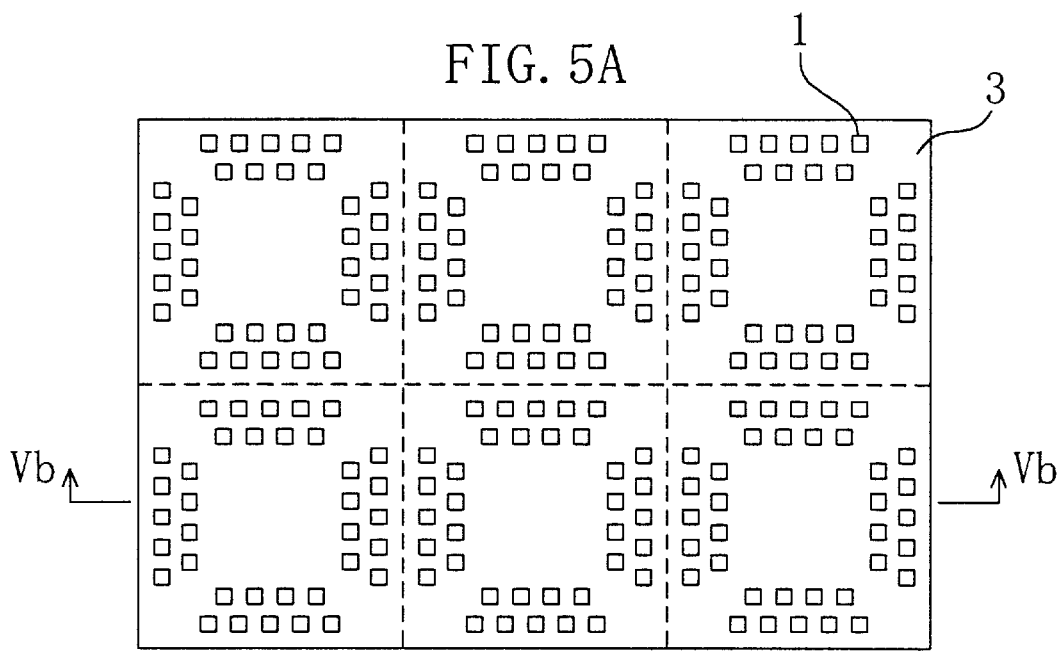
FIGS. 5A, 5B and 5C are respectively plan view, cross-sectional view taken along the line Vb—Vb, and bottom view, illustrating a wiring substrate in accordance with the first embodiment.
Figure 5B:
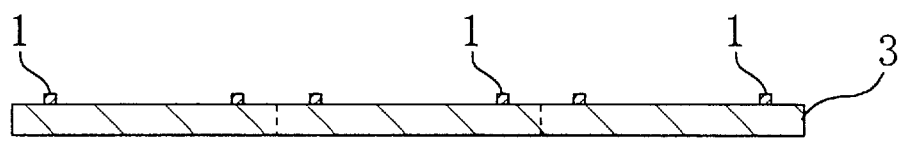
Figure 5C:
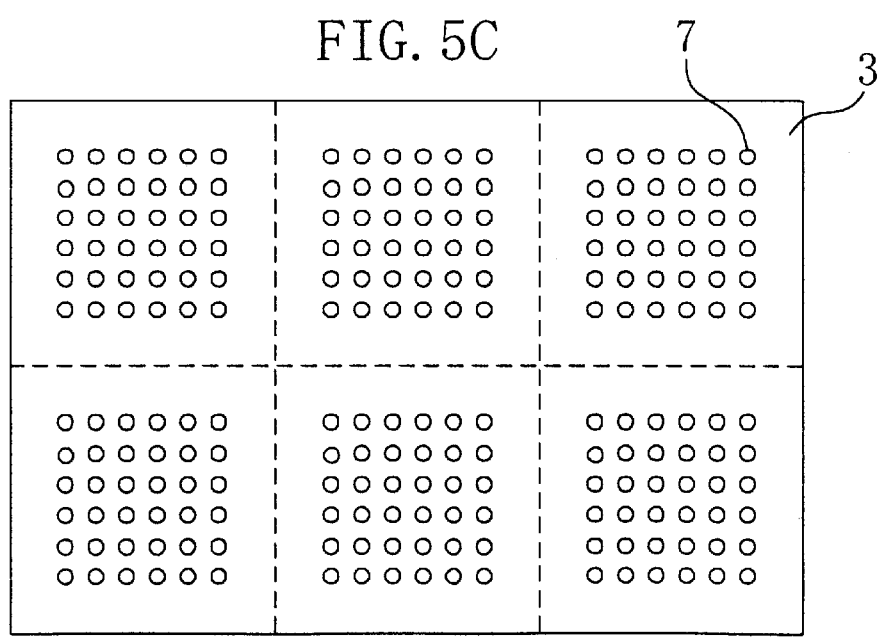
Figure 6A:
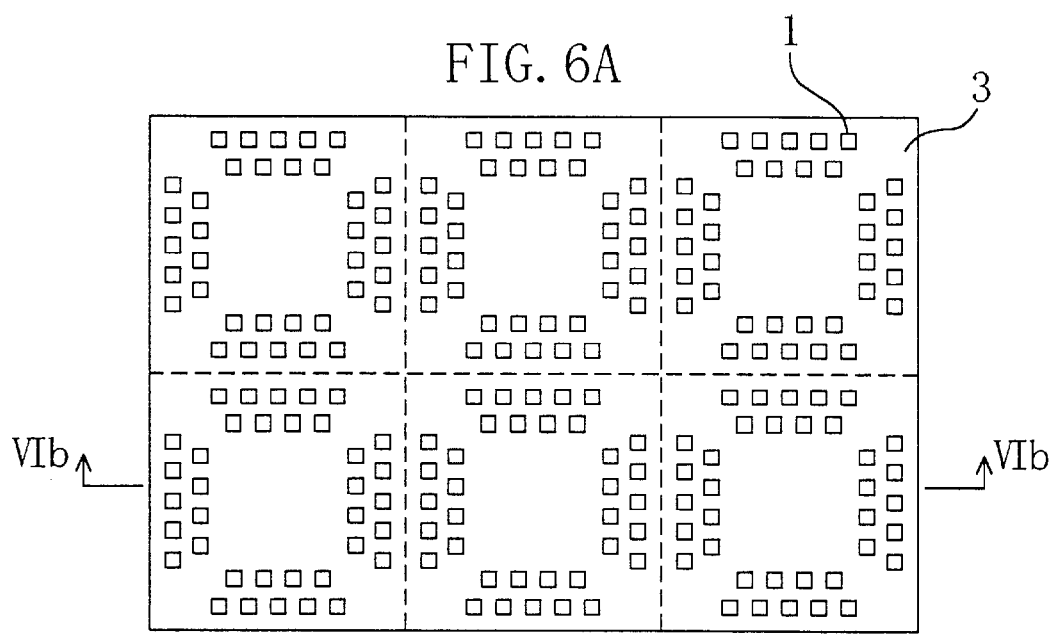
FIGS. 6A and 6B are respectively a plan view, and a cross-sectional view taken along the line VIb—VIb, illustrating a substrate preparation process step in the fabrication process of the semiconductor device of the first embodiment.
Figure 6B:
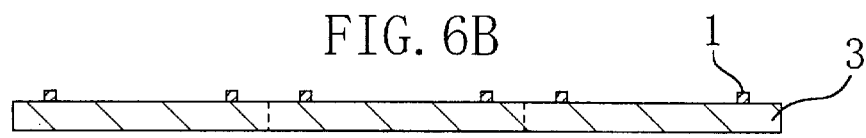
Figure 7A:
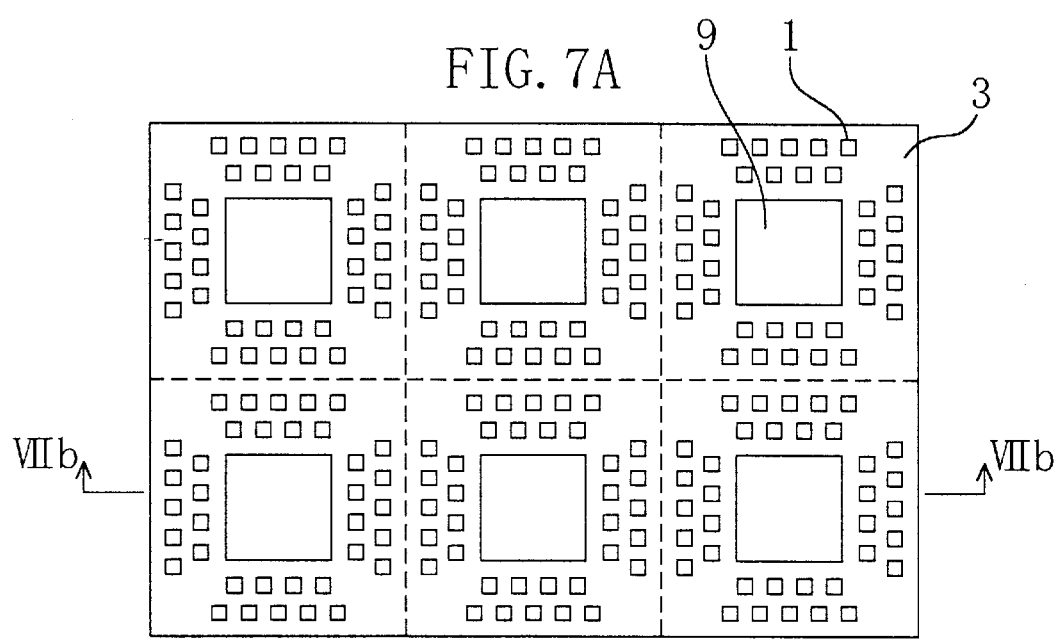
FIGS. 7A and 7B are respectively a plan view, and a cross-sectional view taken along the line VIIb—VIIb, illustrating a die bonding process step in the fabrication process of the semiconductor device of the first embodiment.
Figure 7B:
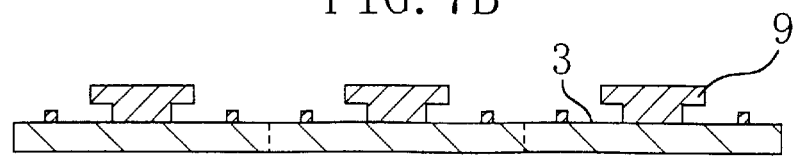
Figure 10A:
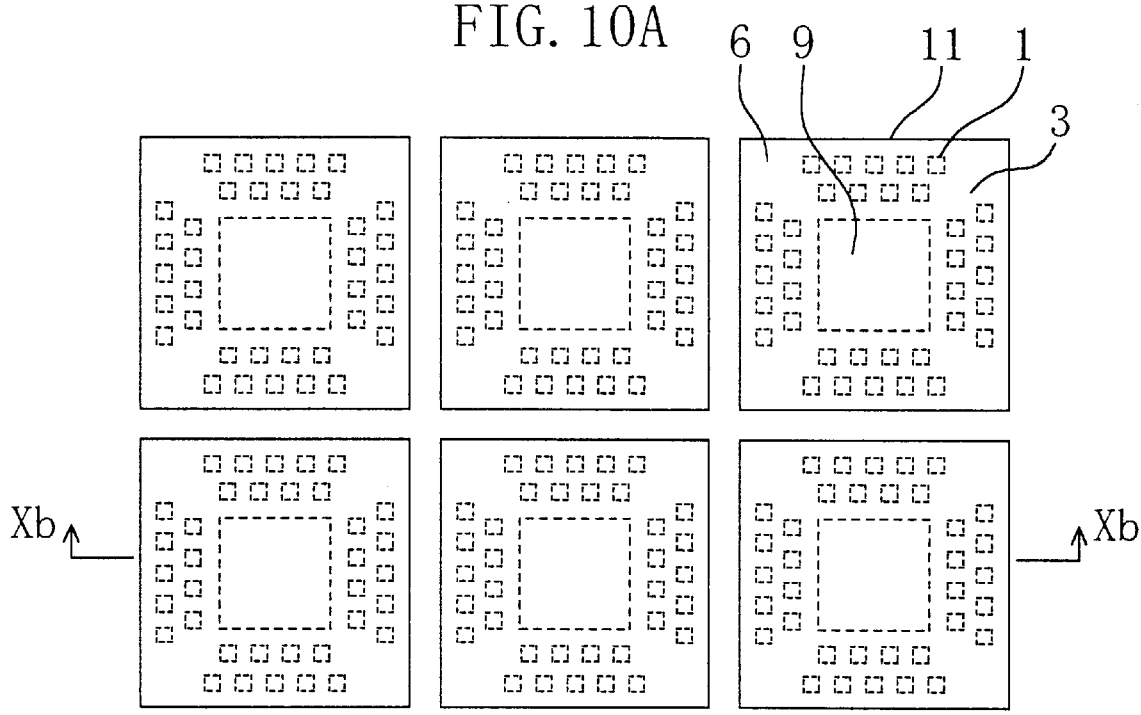
FIGS. 10A and 10B are respectively a plan view, and a cross-sectional view taken along the line Xb—Xb, illustrating a cutting process step in the fabrication process of the semiconductor device of the first embodiment.
Figure 10B:
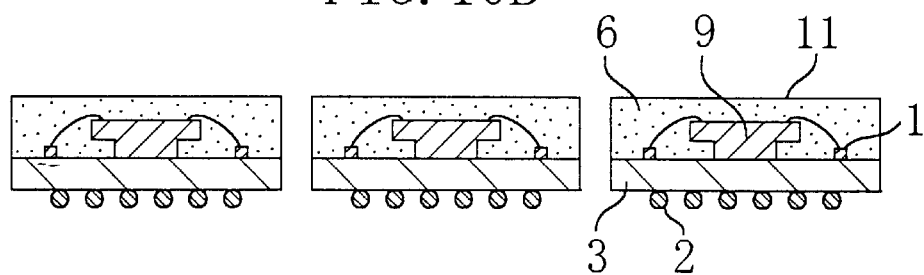

Next, the fabrication process of the semiconductor device of this embodiment will be described. FIGS. 5A, 5B and 5C are respectively plan view, cross-sectional view taken along the line Vb—Vb, and bottom view illustrating a wiring substrate in accordance with this embodiment. FIGS. 6A and 6B are respectively a plan view, and a cross-sectional view taken along the line VIb—VIb, illustrating a substrate preparation process step in the fabrication process of the semiconductor device of this embodiment. FIGS. 7A and 7B are respectively a plan view, and a cross-sectional view taken along the line VIIb—VIIb, illustrating a die bonding process step in the fabrication process of the semiconductor device of this embodiment. FIGS. 8A and 8B are respectively a plan view, and a cross-sectional view taken along the line VIIIb—VIIIb, illustrating a wire bonding process step in the fabrication process of the semiconductor device of this embodiment. FIGS. 9A and 9B are respectively a plan view, and a cross-sectional view taken along the line IXb—IXb, illustrating a resin molding process step in the fabrication process of the semiconductor device of this embodiment. FIGS. 10A and 10B are respectively a plan view, and a cross-sectional view taken along the line Xb—Xb, illustrating a cutting process step in the fabrication process of the semiconductor device of this embodiment.

As shown in FIGS. 5A thorough 5C, the multiple wiring electrodes 1 are formed on the upper surface of the wiring substrate, and external pad electrodes 7 are formed on the lower surface of the wiring substrate. The external pad electrodes 7 are electrically connected to the wiring electrodes 1 through the substrate. The ball electrodes will be attached to the external pad electrodes 7 in the subsequent process step. The wiring substrate prepared is a large-sized substrate on which multiple semiconductor chips will be mounted and which will be later separated into individual semiconductor devices. The broken lines shown in FIGS. 5A and 5C are cutting lines, which will be used to separate the substrate into the individual semiconductor devices. Also, in each of the regions defined by the cutting lines in FIG. 5A, a central area surrounded by the arrays of the wiring electrodes 1 is a chip mounting area where each of the semiconductor chips is mounted by bonding.

First, the wiring substrate with the structure shown in FIGS. 5A through 5C is prepared in the substrate preparation process step shown in FIGS. 6A and 6B.

Next, in the die bonding process step shown in FIGS. 7A and 7B, each of the semiconductor chips having the inverted convex cross-sectional shape is bonded, with an adhesive, onto each of the chip mounting areas of the wiring substrate, with the principal surface of the semiconductor chip 9 facing upward. Specifically, the protruding second bottom face 10*b* of the semiconductor chip 9 and the upper surface of the wiring substrate are secured to each other with the adhesive in this embodiment.

Subsequently, the electrode pads (not shown) of the semiconductor chips 9 and their associate wiring electrodes 1 formed on the wiring substrate are electrically connected to each other with the metal fine wires 5 in the wire bonding process step shown in FIGS. 8A and 8B.

Then, the members disposed on the upper surface of the wiring substrate, e.g., the semiconductor chips 9, wiring electrodes 1 and metal fine wires 5, are molded with the resin encapsulant 6 in the resin molding process step shown in FIGS. 9A and 9B. In this process step, part of the back face of the semiconductor chips 9 is also substantially molded with the resin encapsulant 6. The molding process step is performed by transfer-molding, and the substantially entire region of the wiring substrate except for a marginal portion thereof, which will be used to carry the substrate, for example, is molded. The wiring electrodes 1 and semiconductor chips 9 are indicated by the broken lines in FIG. 9A. However, the metal fine wires 5 are not shown in the figure.

Next, the wiring substrate having the upper surface entirely molded with the resin encapsulant 6, is cut along the cutting lines using a rotary blade in the cutting process step shown in FIGS. 10A and 10B, thereby obtaining individual semiconductor devices 11 of the BGA type. Hence, the semiconductor devices 11 with the structure shown in FIGS. 1, 2, 3 and 4 can be obtained.

In this embodiment, the wiring substrate is cut along the cutting lines indicated by the broken lines shown in FIGS. 5A and 5C by using the rotary blade. In this manner, the individual semiconductor devices can be obtained accurately. Normally, the separation by a rotary blade is performed using a dicing machine generally used in the fabrication process of a semiconductor device. Also, the wiring substrate is cut from either the lower surface or the resin encapsulant 6 side thereof in the known cutting process step. In the fabrication process of this embodiment, the wiring substrate is cut from the lower surface thereof. In this manner, the substrate can be kept immobile while being cut.

In the subsequent process step, which is not shown, in each of the individual semiconductor devices 11, solder balls are attached to the external pad electrodes 7 formed on the lower surface of the wiring substrate 3, thereby forming the ball electrodes 2 which will be used as external terminals.

Alternatively, before cutting the wiring substrate into the individual semiconductor devices 11, the ball electrodes 2 may be formed on the external pad electrodes 7 on the lower surface of the wiring substrate, for each of the large-sized wiring substrates. In this manner, the ball electrodes 2 can be formed more efficiently.

Embodiment 2

Figure 11:
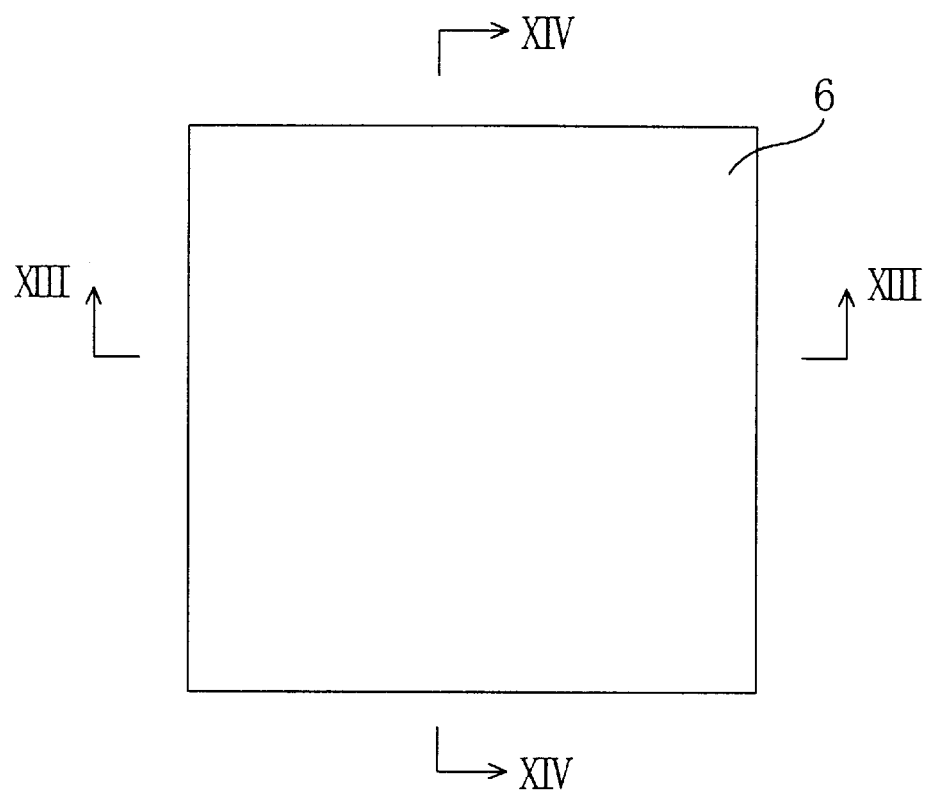
FIG. 11 is a plan view illustrating a semiconductor device in accordance with a second embodiment of the present invention.
Figure 12:
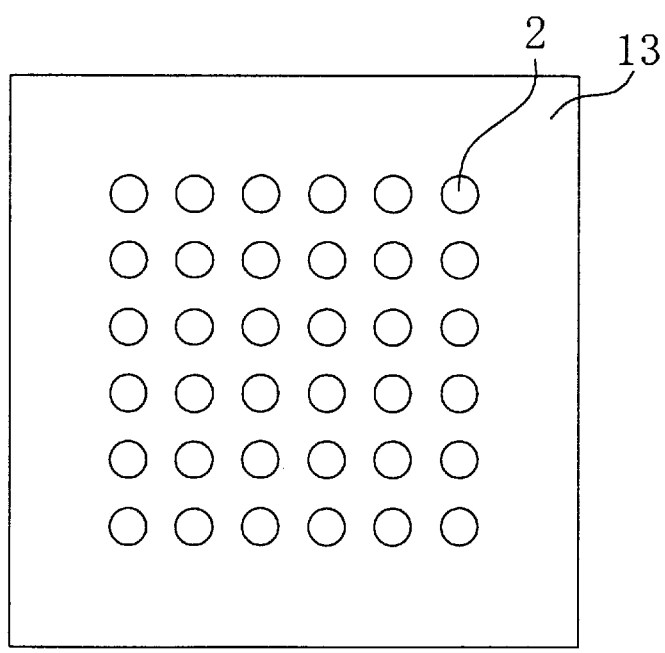
FIG. 12 is a bottom view illustrating the semiconductor device of the second embodiment.
Figure 13:
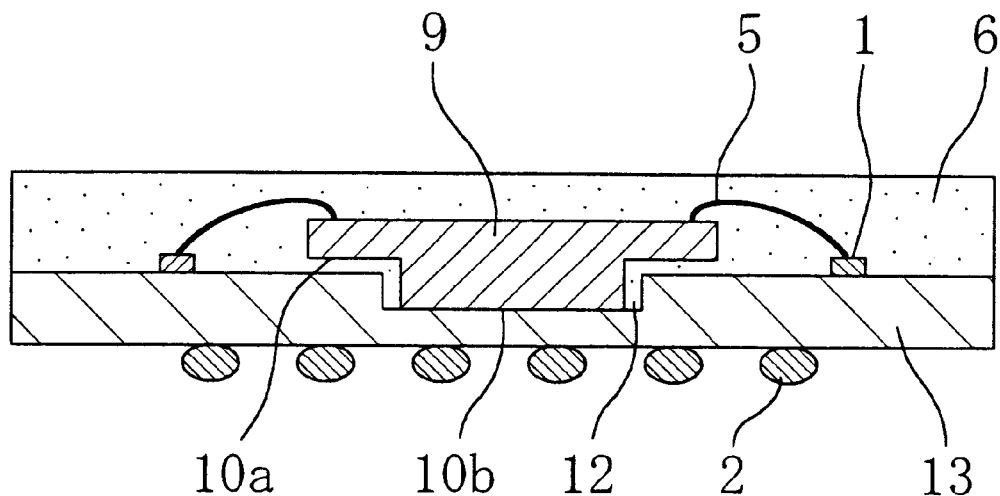
FIG. 13 is a cross-sectional view taken along the line XIII—XIII in FIG. 11, illustrating the semiconductor device of the second embodiment.
Figure 14:
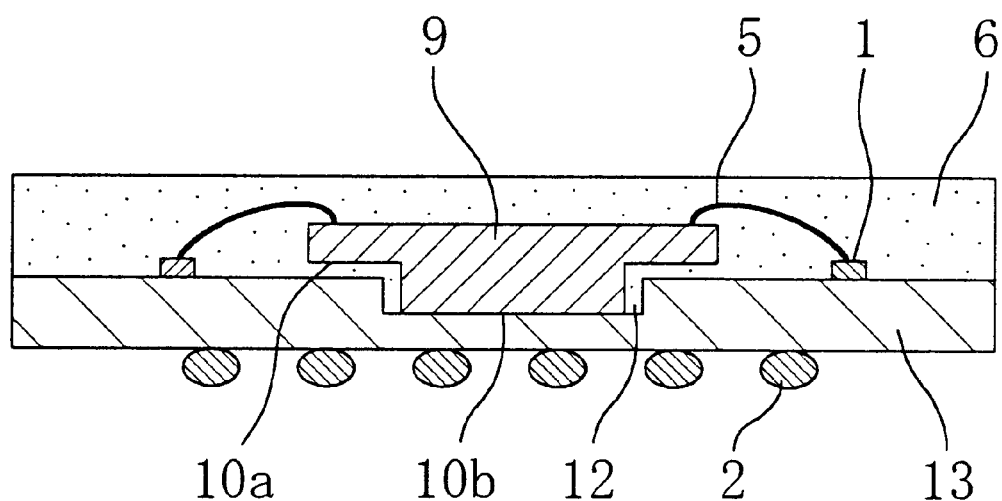
FIG. 14 is a cross-sectional view taken along the line XIV—XIV in FIG. 11, illustrating the semiconductor device of the second embodiment.

FIG. 11 is a plan view illustrating a semiconductor device in accordance with a second embodiment of the present invention. FIG. 12 is a bottom view illustrating the semiconductor device of the second embodiment. FIG. 13 is a cross-sectional view thereof taken along the line XIII—XIII in FIG. 11. FIG. 14 is a cross-sectional view thereof taken along the line XIV—XIV in FIG. 11.

As shown in FIGS. 11, 12, 13 and 14, the semiconductor device of this embodiment includes a wiring substrate 13, wiring electrodes 1, a semiconductor chip 9, metal fine wires 5, ball electrodes 2 and a resin encapsulant 6. The wiring substrate 13 is made of an insulating resin. The wiring electrodes 1 are formed on the wiring substrate 13. The semiconductor chip 9 is mounted on the wiring substrate 13 and the second bottom face of the semiconductor chip 9 is in contact with the wiring substrate 13. Electrode pads (not shown) formed on the principal surface of the semiconductor chip 9 and the wiring electrodes 1 are electrically connected to each other with the metal fine wires 5. The ball electrodes 2 are formed on the lower surface of the wiring substrate 13. The semiconductor chip 9, wiring electrodes 1, metal fine wires 5 and the like are molded with the resin encapsulant 6 on the upper surface of the wiring substrate 13. Although not shown in FIG. 12, external pad electrodes are formed on the lower surface of the wiring substrate 13. The external pad electrodes are electrically connected to the wiring electrodes 1 through the substrate. The ball electrodes 2 are formed on the external pad electrodes. Hence, the semiconductor device of this embodiment has the structure of a semiconductor device of the BGA type.

The semiconductor device according to this embodiment includes the wiring substrate 13 that has, in the upper surface thereof, a concave portion 12 where the semiconductor chip 9 will be disposed. The semiconductor device of this embodiment also includes the semiconductor chip 9 having an inverted convex cross-sectional shape as in the first embodiment. The second bottom face 10*b* of the semiconductor chip 9 is in contact with the bottom face of the concave portion 12. The protrusion length of the second bottom face 10*b* of the semiconductor chip 9 is equal to or less than 50% of the overall thickness (chip thickness) of the semiconductor chip 9. The depth of the concave portion 12 of the wiring substrate 13 is equal to or less than 40% of the chip thickness of the semiconductor chip 9 to be bonded. Thus, when the second bottom face 10*b* of the semiconductor chip 9 is secured to the concave portion 12 of the wiring substrate 13, a gap with a thickness equal to or less than 50% of the chip thickness is formed between the bottom face of the concave portion 12 and the first bottom face 10*a* of the semiconductor chip 9. In addition, a gap with a thickness equal to or less than 10% of the chip thickness is also formed between the upper surface of the wiring substrate 13 and the first bottom face 10*a* of the semiconductor chip 9, and the resin encapsulant 6 exists in the respective gaps. The second bottom face 10*b* of the semiconductor chip 9 is located approximately in a center region of the back face of the semiconductor chip 9.

Also in the semiconductor device of this embodiment, the ball electrodes 2 attached to the wiring substrate 13 are solder balls. The solder balls are attached so that the overall semiconductor device can be highly reliably mounted and bonded onto a motherboard. In addition, as shown in FIG. 12, the ball electrodes 2 are arranged on the lower surface of the wiring substrate 13 in a latticed shape.

The BGA type semiconductor device of this embodiment includes the semiconductor chip 9, the back face of which has the first bottom face 10*a* and the second bottom face 10*b* protruding from the first bottom face 10*a*. Also, the wiring substrate 13 includes the concave portion 12 and the second bottom face 10*b* of the semiconductor chip 9 is in contact with the bottom face of the concave portion 12. Such structure of the semiconductor device allows part of the resin encapsulant 6 to exist in the gaps formed respectively between the first bottom face 10*a* of the semiconductor chip 9 and the upper surface of the wiring substrate 13 and between the first bottom face 10*a* of the semiconductor chip 9 and the bottom face of the concave portion 12. Thus, the semiconductor device can have its humidity resistance increased, and also can have its stress resistance to impact given to the resin encapsulant 6 and wiring substrate 13 from the outside, improved.

In the known semiconductor device shown in FIG. 23, when water or moisture enters from between the wiring substrate 103 and resin encapsulant 106, the water or moisture soon reaches the principal surface of the semiconductor chip 104 through the side faces thereof. Thus, the reliability of the semiconductor device might deteriorate.

In contrast, in the semiconductor device of this embodiment, even when water or moisture enters from between the wiring substrate 13 and resin encapsulant 6, the water or moisture does not reach the principal surface of the semiconductor chip 9 soon. The water or moisture first reaches the first bottom face 10a through side walls between the first and second bottom faces 10a and 10b before reaching the principal surface of the semiconductor chip 9, as in the semiconductor device of the first embodiment. Therefore, it is possible to suppress the water, for example, from entering into the area where an integrated circuit is formed, thus allowing the semiconductor device to have its humidity resistance increased. In addition, since the concave portion 12 is formed, the water or moisture has to follow a longer path in order to penetrate through the side faces of the concave portion 12, as compared to the first embodiment.

Also, in the semiconductor device of this embodiment, the area where the resin encapsulant 6 and semiconductor chip 9 are in contact with each other and the area where the resin encapsulant 6 and wiring substrate 13 are in contact with each other are both increased by the total area of the first bottom face 10a and the side faces of the concave portion 12, as compared to the known semiconductor device. In addition, the concave portion 12 of the wiring substrate 13 and the part of the resin encapsulant 6, which surrounds the semiconductor chip 9 in the concave portion 12, engage each other. Thus, the resin encapsulant 6 and semiconductor chip 9 are secured to each other more strongly, and so are the resin encapsulant 6 and wiring substrate 13. Accordingly, the semiconductor device has its stress resistance to impact from the outside improved. Besides, in the semiconductor device of this embodiment, the area where the resin encapsulant 6 and wiring substrate 13 are in contact with each other is increased by the area of the first bottom face 10a and the depth of the concave portion 12, as compared to the semiconductor device of the first embodiment. Therefore, the resin encapsulant 6 and wiring substrate 13 are secured to each other even more strongly, and thus the stress resistance of the semiconductor device to impact from the outside also improves further, which greatly contributes to the further improvement of the overall reliability of the semiconductor device.

Figure 15A:
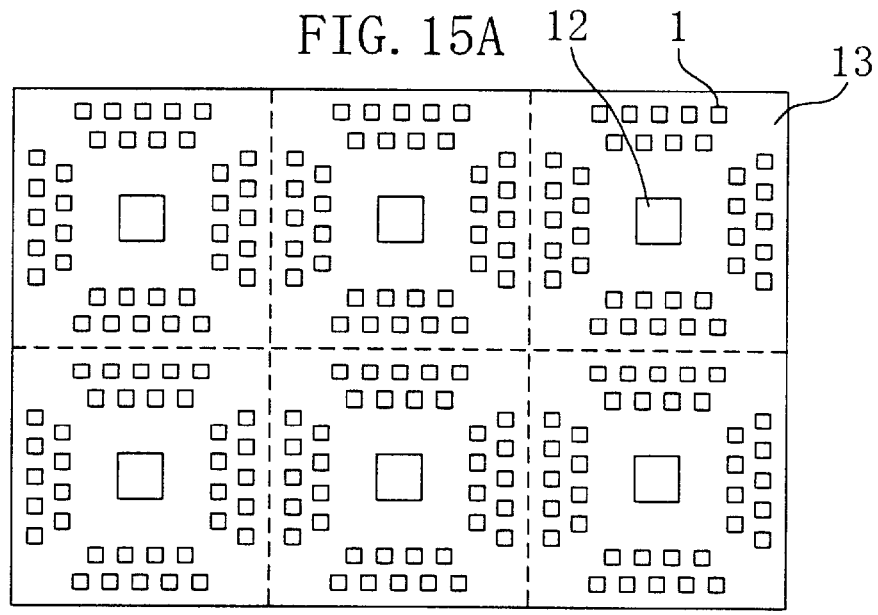
FIGS. 15A, 15B and 15C are respectively plan view, cross-sectional view taken along the line XVb—XVb, and bottom view illustrating a wiring substrate in accordance with the second embodiment.
Figure 15B:
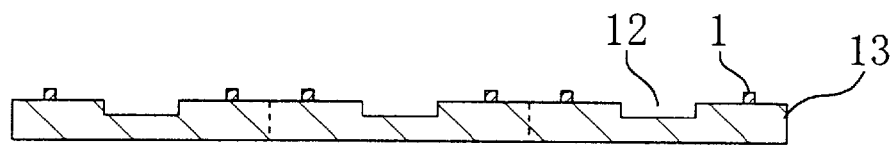
Figure 15C:
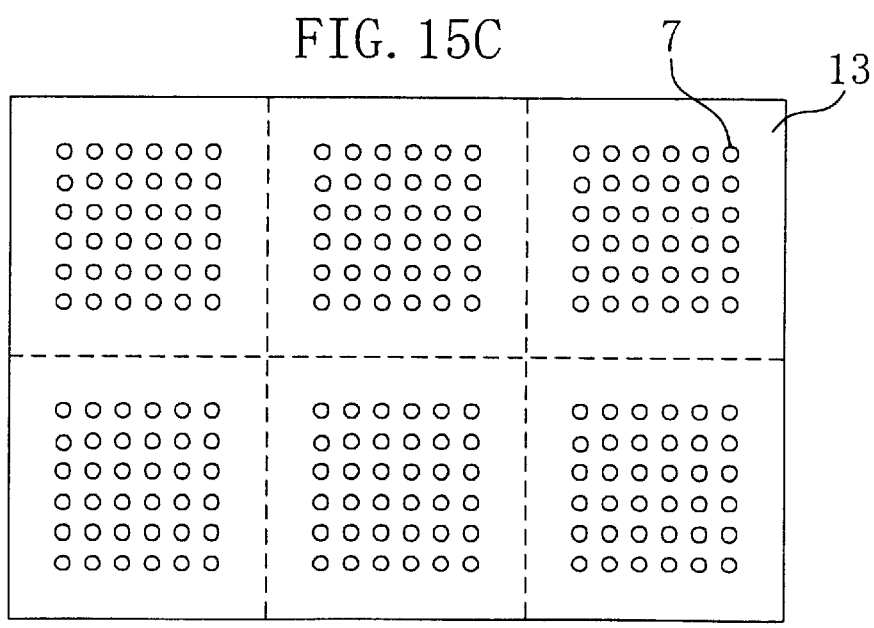
Figure 16A:
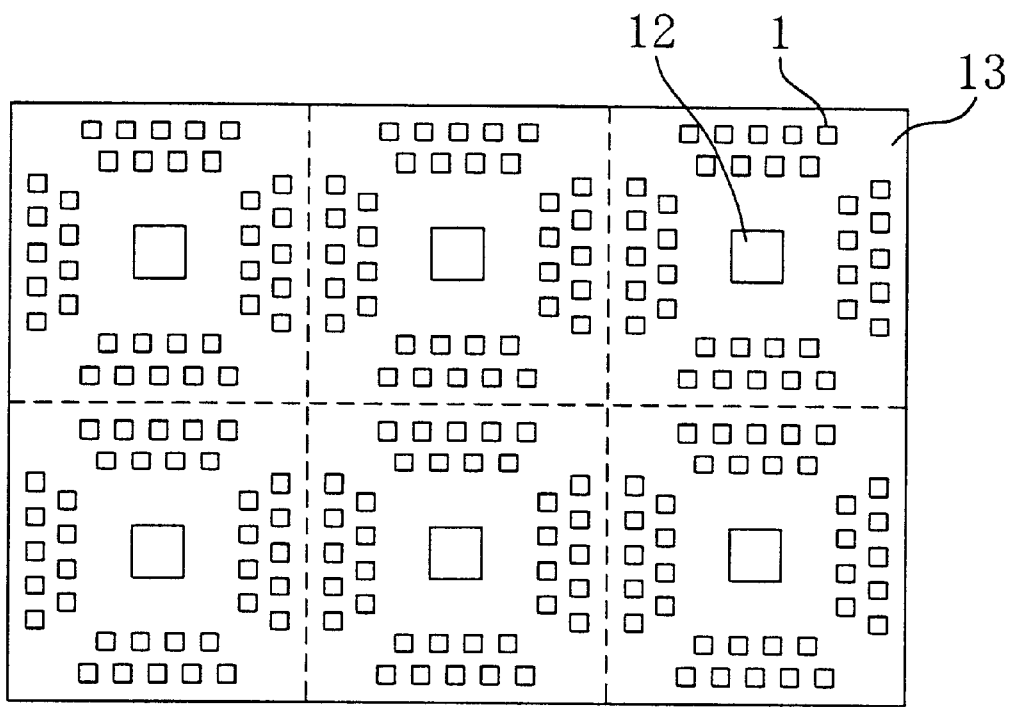
FIGS. 16A and 16B are respectively a plan view, and a cross-sectional view taken along the line XVIb—XVIb, illustrating a substrate preparation process step in the fabrication process of the semiconductor device of the second embodiment.
Figure 16B:
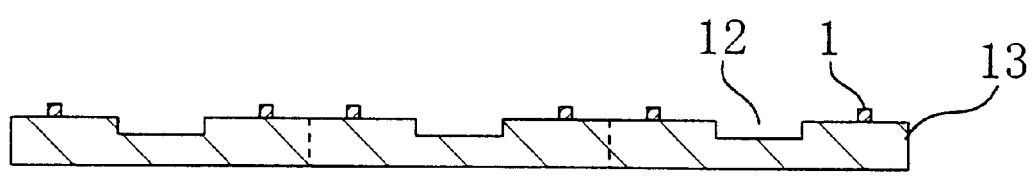
Figure 17A:
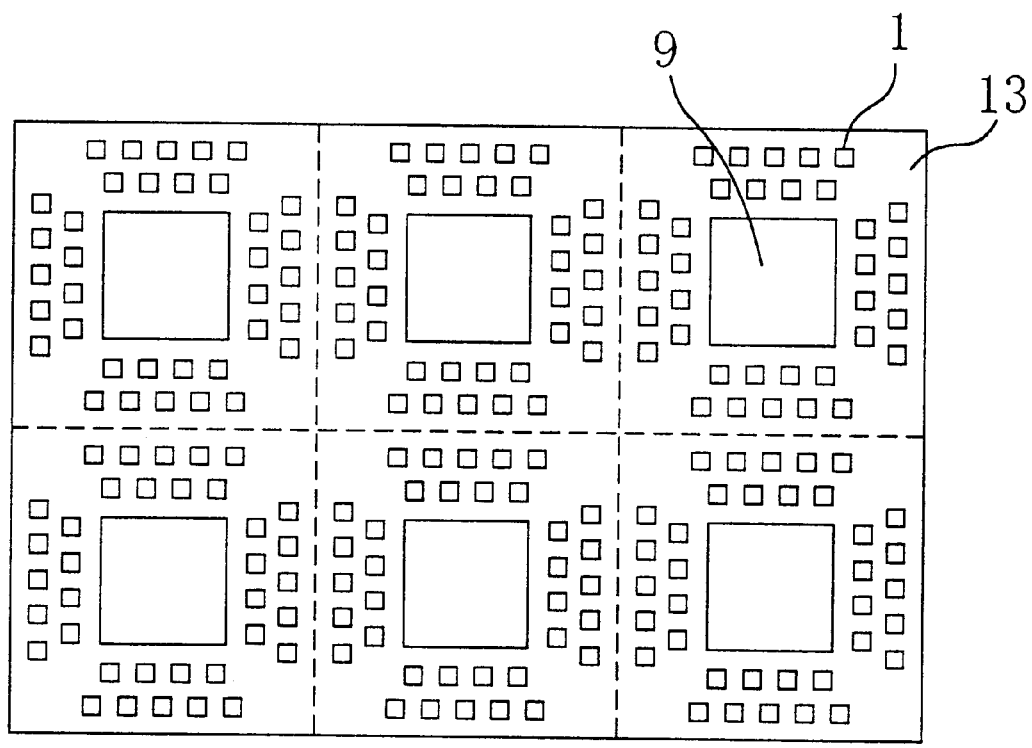
FIGS. 17A and 17B are respectively a plan view, and a cross-sectional view taken along the line XVIIb—XVIIb, illustrating a die bonding process step in the fabrication process of the semiconductor device of the second embodiment.
Figure 17B:
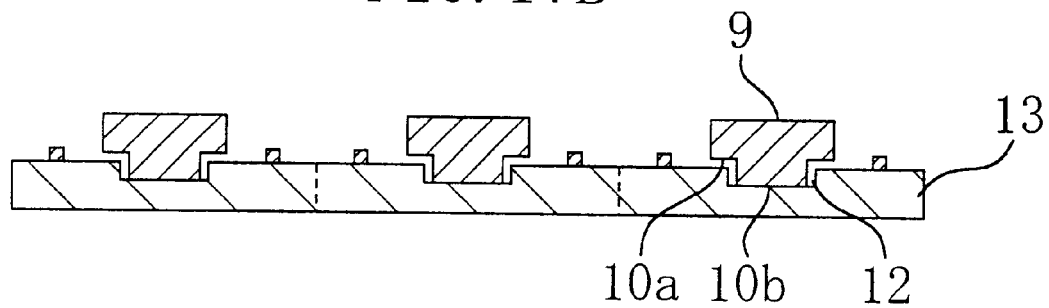
Figure 18A:
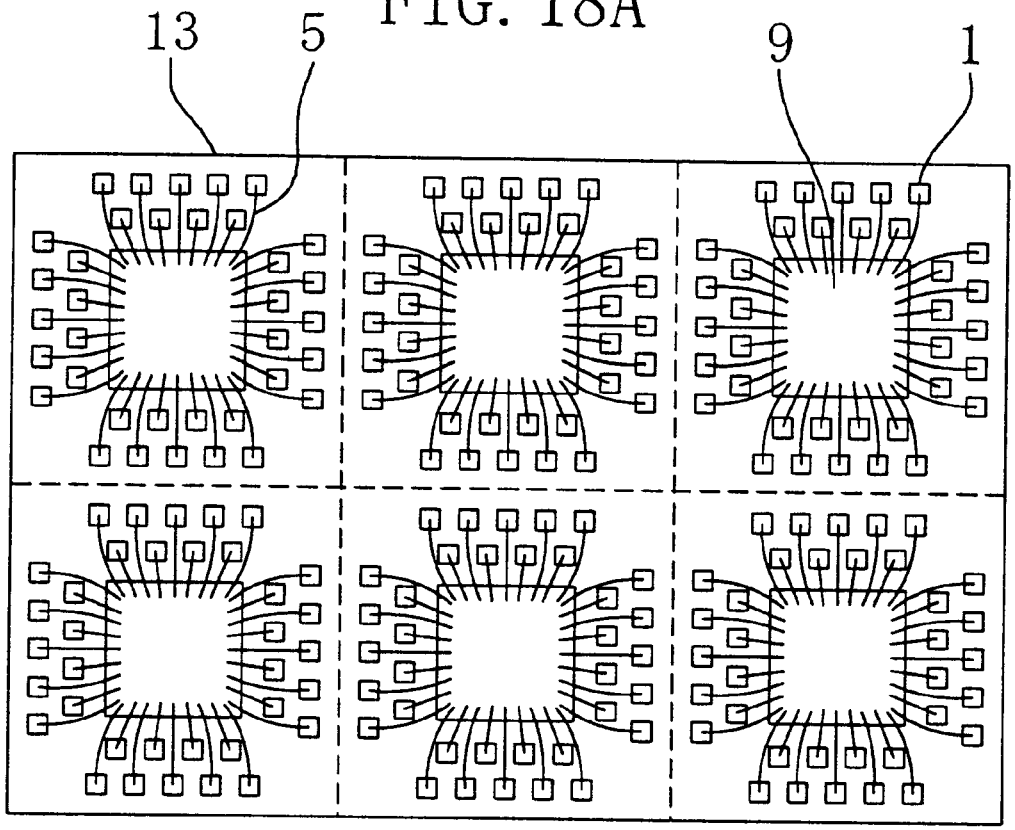
FIGS. 18A and 18B are respectively a plan view, and a cross-sectional view taken along the line XVIIIb—XVIIIb, illustrating a wire bonding process step in the fabrication process of the semiconductor device of the second embodiment.
Figure 18B:
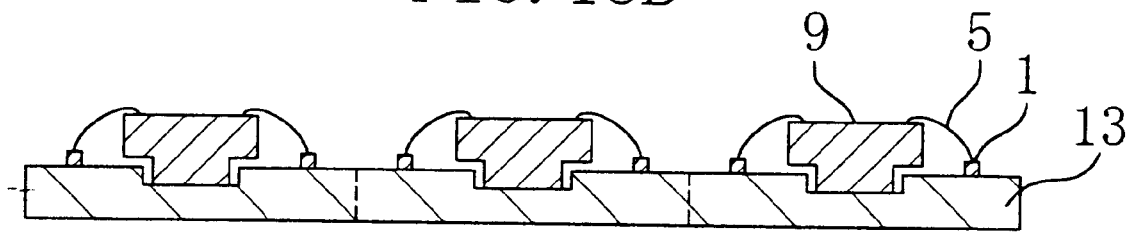

Next, the fabrication process of the semiconductor device of this embodiment will be described. FIGS. 15A, 15B and 15C are respectively plan view, cross-sectional view taken along the line XVb—XVb, and bottom view illustrating a wiring substrate in accordance with this embodiment. FIGS. 16A and 16B are respectively a plan view, and a cross-sectional view taken along the line XVIb—XVIb, illustrating a substrate preparation process step in the fabrication process of the semiconductor device of this embodiment. FIGS. 17A and 17B are respectively a plan view, and a cross-sectional view taken along the line XVIIb—XVIIb, illustrating a die bonding process step in the fabrication process of the semiconductor device of this embodiment. FIGS. 18A and 18B are respectively a plan view, and a cross-sectional view taken along the line XVIIIb—XVIIIb, illustrating a wire bonding process step in the fabrication process of the semiconductor device of this embodiment.

Figure 19A:
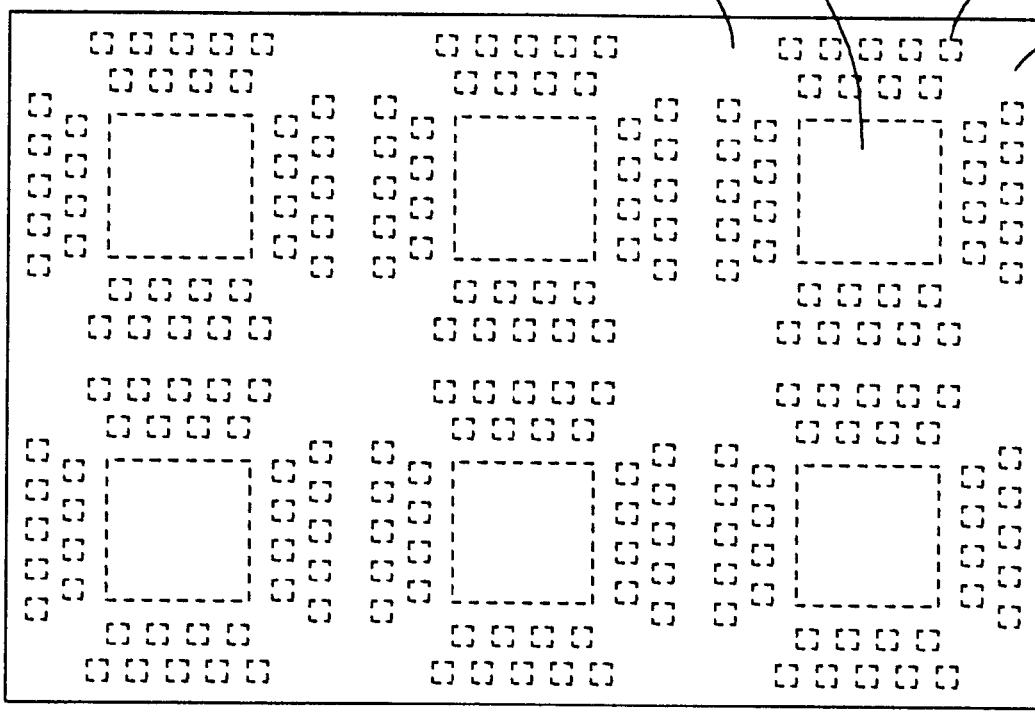
FIGS. 19A and 19B are respectively a plan view, and a cross-sectional view taken along the line XIXb—XIXb, illustrating a resin molding process step in the fabrication process of the semiconductor device of the second embodiment.
Figure 19B:
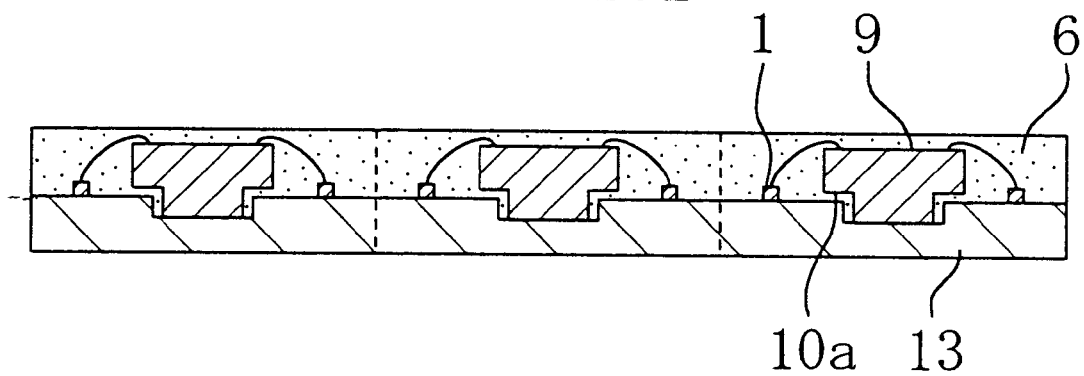
Figure 20A:
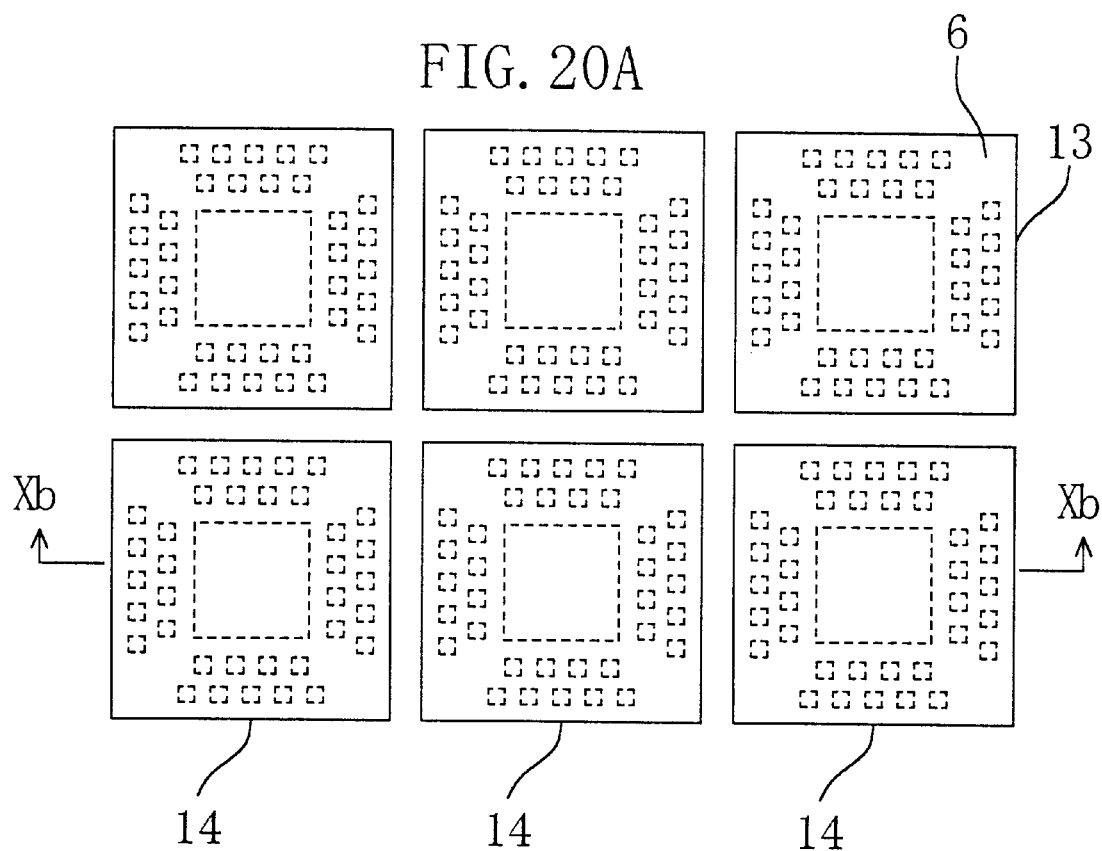
FIGS. 20A and 20B are respectively a plan view, and a cross-sectional view taken along the line XXb—XXb, illustrating a cutting process step in the fabrication process of the semiconductor device of the second embodiment.
Figure 20B:
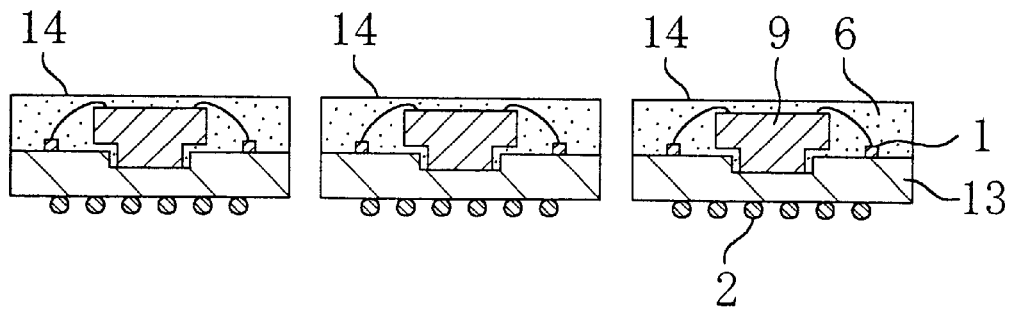
Figure 21:
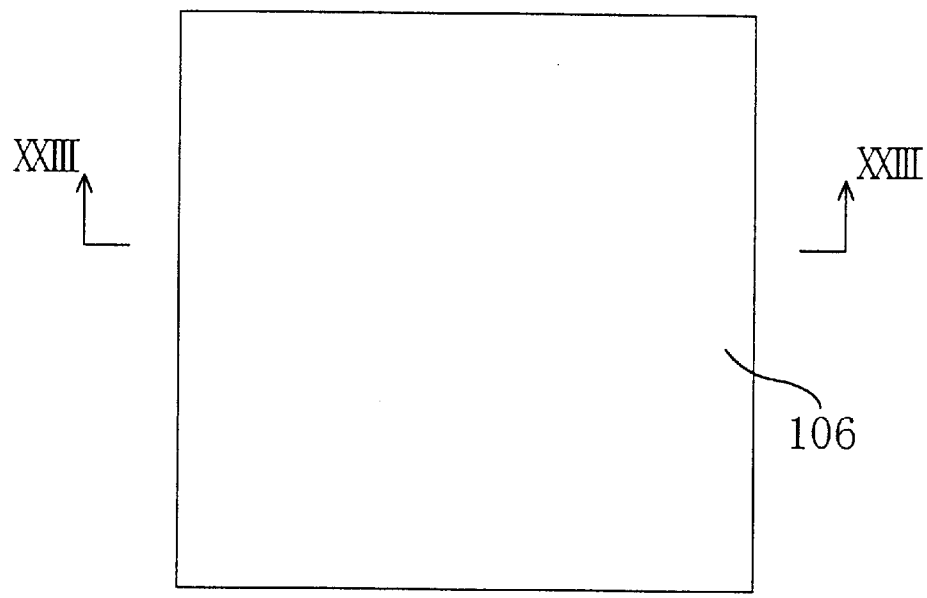
FIG. 21 is a plan view illustrating a known semiconductor device of the BGA type.
Figure 22:
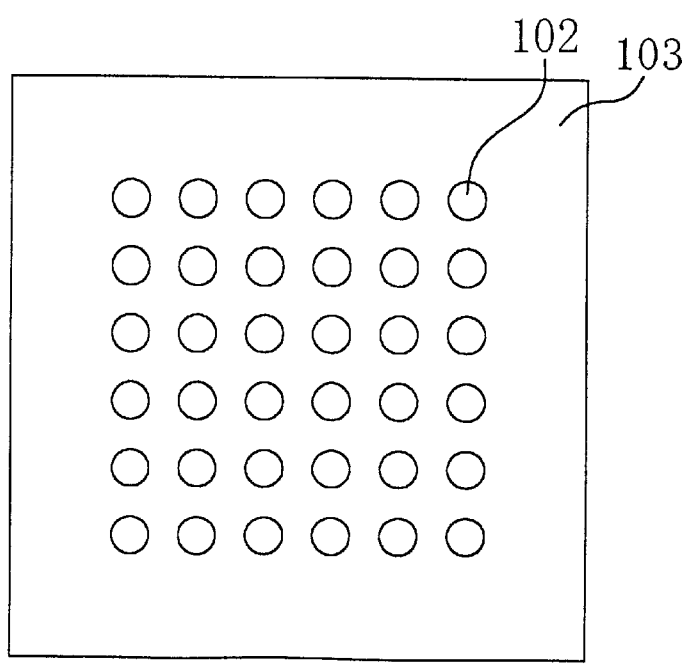
FIG. 22 is a bottom view illustrating the known BGA type semiconductor device.

FIGS. 19A and 19B are respectively a plan view, and a cross-sectional view taken along the line XIXb—XIXb, illustrating a resin molding process step in the fabrication process of the semiconductor device of this embodiment. FIGS. 20A and 20B are respectively a plan view, and a cross-sectional view taken along the line XXb—XXb, illustrating a cutting process step in the fabrication process of the semiconductor device of this embodiment.

As shown in FIGS. 15A thorough 15C, the multiple wiring electrodes 1 are formed on the upper surface of the wiring substrate, and external pad electrodes 7 are formed on the lower surface of the wiring substrate. The external pad electrodes 7 are electrically connected to the wiring electrodes 1 through the substrate. The concave portion 12, on which the semiconductor chip will be disposed, is formed in the middle portion of the upper surface of each of the regions defined by the cutting lines on the wiring substrate. The ball electrodes will be attached to the external pad electrodes 7 in the subsequent process step. The wiring substrate prepared is a large-sized substrate on which multiple semiconductor chips will be mounted and which will be later separated into individual semiconductor devices. The broken lines shown in FIGS. 15A and 15C are cutting lines, which will be used to separate the substrate into the individual semiconductor devices. In each of the regions defined by the cutting lines in FIG. 15, a central area surrounded by the arrays of the wiring electrodes 1 is a chip mounting area where each of the semiconductor chips is mounted by bonding.

First, the wiring substrate with the structure shown in FIGS. 15A through 15C is prepared in the substrate preparation process step shown in FIGS. 16A and 16B. The wiring substrate prepared includes the concave portions 12 that have a depth equal to or less than 40% of the chip thickness of the semiconductor chip 9 to be mounted.

Next, in the die bonding process step shown in FIGS. 17A and 17B, each of the semiconductor chips having the inverted convex cross-sectional shape is bonded, with an adhesive, onto each of the concave portions 12 of the wiring substrate, with the principal surface of the semiconductor chip facing upward. In this case, the depth of the concave portion 12 is smaller than the protrusion length of the second bottom face 10b of the semiconductor chip 9. Thus, when the semiconductor chip 9 is bonded, the first bottom face 10a thereof is located above the upper surface of the wiring substrate. The planar size of the concave portion 12 of the wiring substrate is greater than that of the second bottom face 10b of the semiconductor chip 9 so that the convex portion of the semiconductor chip 9 is located in the concave portion 12 of the wiring substrate. Hence, when the semiconductor chip 9 is mounted on the wiring substrate, gaps are formed, respectively, between the upper surface of the wiring substrate and the first bottom face 10a of the semiconductor chip 9 and between the bottom face of the concave portion 12 of the wiring substrate and the first bottom face 10a of the semiconductor chip 9.

Subsequently, the electrode pads (not shown) of the semiconductor chips 9 and their associate wiring electrodes 1 formed on the wiring substrate are electrically connected to each other with the metal fine wires 5 in the wire bonding process step shown in FIGS. 18A and 18B.

Next, the members disposed on the upper surface of the wiring substrate, e.g., the semiconductor chips 9, wiring electrodes 1 and metal fine wires 5, are molded with the resin encapsulant 6 in the resin molding process step shown in FIGS. 19A and 19B. In this process step, part of the back face of the semiconductor chips 9 is also substantially molded with part of the resin encapsulant 6. The molding process step is performed by transfer-molding, and the substantially entire region of the wiring substrate except for a marginal portion thereof, which will be used to carry the substrate, for example, is molded. The wiring electrodes 1 and semiconductor chips 9 are indicated by the broken lines in FIG. 19A. However, the metal fine wires 5 are not shown in the figure.

Next, the wiring substrate having the upper surface entirely molded with the resin encapsulant 6 is cut along the cutting lines using a rotary blade in the cutting process step shown in FIGS. 20A and 20B, thereby obtaining individual semiconductor devices 11 of the BGA type. Hence, the semiconductor devices 11 with the structure shown in FIGS. 11, 12, 13 and 14 can be obtained.

In this embodiment, the wiring substrate is cut along the cutting lines indicated by the broken lines shown in FIGS. 15A and 15C by using the rotary blade. In this manner, the individual semiconductor devices can be obtained accurately. Normally, the separation by a rotary blade is performed using a dicing machine generally used in the fabrication process of a semiconductor device. Also, the wiring substrate is cut from either the lower surface or the resin encapsulant 6 side thereof in the known cutting process step. In the fabrication process of this embodiment, the wiring substrate is cut from the lower surface thereof. In this manner, the substrate can be kept immobile while being cut.

In the subsequent process step, which is not shown, in each of the individual semiconductor devices 11, solder balls are attached to the external pad electrodes 7 formed on the lower surface of the wiring substrate 13, thereby forming the ball electrodes 2 which will be used as external terminals.

Alternatively, before cutting the wiring substrate into the individual semiconductor devices 11, the ball electrodes 2 may be formed on the pad electrodes 7 on the lower surface of the wiring substrate, for each of the large-sized wiring substrates. In this manner, the ball electrodes 2 can be formed more efficiently.

According to the method for fabricating the semiconductor device of this embodiment, the large-sized substrate, on which the multiple semiconductor chips can be mounted, is separated into the individual semiconductor devices in the single cutting process step performed in the end, and the semiconductor chip with the inverted convex cross-sectional shape is used. Accordingly, the semiconductor device of the BGA type with reliable humidity resistance, for example, can be obtained.

Embodiment 3

In a third embodiment, it will be described how to fabricate a semiconductor chip. The semiconductor chip used in the first and second embodiments of the present invention is fabricated basically by grinding the back face of a semiconductor wafer using a dicing blade (rotary blade) and then separating the semiconductor wafer into individual semiconductor chips using another dicing blade. Specifically, the following process steps are performed.

First, a semiconductor wafer having a principal surface, on which multiple semiconductor chips have been formed, is prepared. Then, the principal surface of the semiconductor wafer is bonded onto a retainer such as a sheet in order to be fixed. With the principal surface being fixed, the back face of the semiconductor wafer, which is opposite to the principal surface thereof, is partially ground to a depth by a grinding process, for example, thereby forming a number of grooves.

Figure 28:
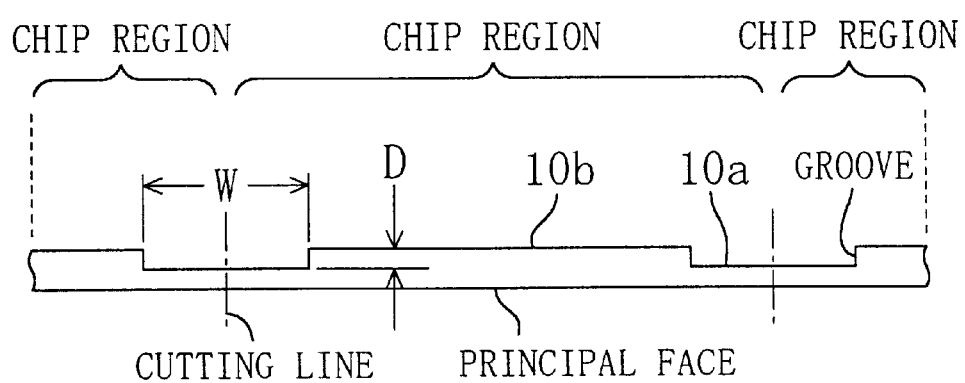
FIG. 28 is a cross-sectional view illustrating a semiconductor wafer immediately before a dicing process step in a third embodiment of the present invention.

FIG. 28 is a cross-sectional view illustrating the semiconductor wafer immediately before a dicing process step. As shown in FIG. 28, the grooves with a depth D and a width W are formed in the back face of the semiconductor wafer. The bottom face of the groove will be the first bottom face of the semiconductor chip, and the back face of the semiconductor chip except for the groove portion will be the second bottom face of the semiconductor chip. The second bottom face protrudes from the first bottom face. The center line of the groove substantially matches a cutting line.

An exemplary method for forming the grooves on the back face of the semiconductor wafer is by grinding an area located at the outer portion of a chip region in the back face of the semiconductor wafer. In this case, as shown in FIG. 28, the area, which is located at both sides of the cutting line, is removed by a grinding process, thereby forming the groove. Where the grinding process is performed using a dicing blade only, the dicing blade may have a large width of about 200 $\mu$m and the grooves may have a depth of 30–70%, preferably 50% of the thickness of the semiconductor wafer (half cutting). In this embodiment, the semiconductor wafer with a thickness of 200 $\mu$m is used and ground to a depth of only 100 $\mu$m from the back face thereof, thereby forming the groove with a width W of 3.05 mm and a depth D of 100 $\mu$m. Where the width W of the groove is larger than the width of the dicing blade, grindings are performed multiple times for forming the groove. In this manner, the first bottom face 10a is formed at the outer portion of the chip region of the semiconductor wafer, and the second bottom face 10b exists in the central portion of the chip region surrounded by the outer portion.

Then, the semiconductor wafer with the grooves formed in the back face thereof is diced using a dicing blade with a width of 50 $\mu$m (full cutting). In this manner, semiconductor chips are cut from the semiconductor wafer. Each of the semiconductor chips cut from the semiconductor wafer has, for example, planar sizes of 10 mm square and the first bottom face 10a with a width of about 1.5 mm.

It should be noted that the dicing blade to be used may have a width of greater than 200 $\mu$m and may be selected depending on the width W of a required groove. Also where a dicing blade with a relatively small width is used, the remaining portion of the semiconductor wafer, which is located under the groove, may be thinned by grinding the semiconductor wafer multiple times.

In this embodiment, the semiconductor wafer is ground to a depth of 30–70%, preferably 50% of the thickness thereof. This is because, in this manner, part of the resin encapsulant with a necessary thickness is interposed between the back face of the semiconductor chip and the wiring substrate when each of the individual semiconductor chips that have been separated from the semiconductor wafer is molded with the resin encapsulant. Thus the reliability of the semiconductor device can be obtained. However, the part of the semiconductor chip, which is located on the first bottom face 10a thereof, needs to be thick enough to resist to a stress, which is necessarily applied when each of the semiconductor chips separated from the semiconductor wafer is connected with a connecting member such as a metal fine wire. For this reason, the part of the semiconductor wafer, which is located under the bottom face of the groove, preferably has a thickness equal to or greater than 100 $\mu$m. In this case, the thickness of the part of the semiconductor wafer is naturally thinner than the chip thickness.

In addition, the dicing blade to be used to separate the semiconductor wafer into the multiple semiconductor chips may have a width smaller than that of the dicing blade used for forming the grooves. For example, a generally used dicing blade with a width of about 50 μm may be used.

The semiconductor chip, which is each of the chip regions of the semiconductor wafer shown in FIG. 28, has a convex cross-sectional shape, and the second bottom face 10b located at the central portion protrudes upward from the first bottom face 10a located at the outer portion. Thus, when the principal surface of the semiconductor chip faces upward, the semiconductor chip has an inverted convex cross-sectional shape. The first bottom face 10a of the semiconductor chip has a width of 1.5 mm. In this embodiment, the area of the second bottom face 10b is about 50% of the total area of the semiconductor chip. The first bottom face 10a preferably has a width of 0.4 mm or more, and 90% or less than the side length of the semiconductor chip. If the width of the first bottom face 10a is less than 0.4 mm, effects of the resin encapsulant and semiconductor chip strongly secured to each other, and the resin encapsulant and wiring substrate strongly secured to each other, can be hardly achieved. Also if the first bottom face 10a has a width greater than 90% of the side length of the semiconductor chip, it will be difficult to steadily secure the semiconductor chip to the wiring substrate in the die bonding process step.

It should be noted that the first bottom face 10a does not have to be formed at the outer portion of the semiconductor chip as it is formed in this embodiment. For example, multiple slit grooves may be formed in the semiconductor chip. For example, two grooves may intercross each other. In a semiconductor device including a semiconductor chip with such a structure, part of the resin encapsulant is also interposed between the first bottom face of the semiconductor chip and the wiring substrate after the molding process has been performed. Thus, the resin encapsulant and semiconductor chip are more strongly secured to each other, and so are the resin encapsulant and wiring substrate. Accordingly the reliability of the semiconductor device improves.

Specifically, as described in this embodiment, the semiconductor devices of the BGA type described in the first and second embodiments include the semiconductor chip 9 having the first bottom face 10a and the second bottom face 10b that protrudes downward from the first bottom face 10a. Also, the members disposed on the upper surface of the wiring substrate 3 (or 13) are molded with the resin encapsulant 6. Thus, part of the resin encapsulant 6 exists between the first bottom face 10a of the semiconductor chip 9 and the upper surface of the wiring substrate 3 (or 13). Accordingly, a part of the back face of the semiconductor chip 9 is held by the resin encapsulant. As a result, the semiconductor device can have its humidity resistance increased and also can have its stress resistance to impact from the outside, improved.

Further, as mentioned in the description of the method for fabricating the semiconductor chip of this embodiment, when the semiconductor chip 9 with the inverted convex cross-sectional shape is used, the effect described in the first and second embodiments can be attained.

It should be noted that the method for forming the grooves in the back face of the semiconductor wafer is not limited to grinding but the grooves may also be formed by any other removing methods such as etching using a mask, sand blast, or electrical discharge machining using, as an electrode, a groove pattern formed in a whole semiconductor wafer.

What is claimed is:

1. A semiconductor device comprising:
 a wiring substrate, which includes a wiring electrode and an external electrode, respectively, on the upper surface and the lower surface of the wiring substrate, the external electrode being to be electrically connected to the wiring electrode;
 a semiconductor chip, which includes:
  a principal surface,
  a first bottom face which is opposite to the principal surface, and
  a second bottom face which protrudes from the first bottom face,
 the semiconductor chip being mounted on the wiring substrate with the second bottom face being in contact with the upper surface of the wiring substrate;
 an electrode, which is formed on the principal surface of the semiconductor chip;
 a connecting member, which is used to connect the electrode of the semiconductor chip and the wiring electrode formed on the wiring substrate electrically to each other; and
 an resin encapsulant, which molds the semiconductor chip, the connecting member and the wiring electrode on the upper surface of the wiring substrate,
 wherein a part of the resin encapsulant exists between the first bottom face of the semiconductor chip and the upper surface of the wiring substrate.

2. The device of claim 1, wherein a concave portion is formed in the upper surface of the wiring substrate,
 wherein the wiring electrode is formed outside the concave portion, and
 wherein the second bottom face of the semiconductor chip is in contact with the bottom face of the concave portion of the wiring substrate.

3. The device of claim 1, wherein in the semiconductor chip, a protrusion length of the second bottom face from the first bottom face is equal to or less than 50% of a thickness of the semiconductor chip.

4. The device of claim 1, wherein the second bottom face is located approximately in a center region of the back face of the semiconductor chip.

5. The device of claim 1, further comprising a ball electrode which is attached to the external electrode of the wiring substrate.

* * * * *